(12) United States Patent
Fayrushin et al.

(10) Patent No.: US 11,974,430 B2
(45) Date of Patent: Apr. 30, 2024

(54) MICROELECTRONIC DEVICES WITH DOPANT EXTENSIONS NEAR A GIDL REGION BELOW A TIER STACK, AND RELATED METHODS AND SYSTEMS

(71) Applicant: Micron Technology, Inc., Boise, ID (US)

(72) Inventors: Albert Fayrushin, Boise, ID (US); Haitao Liu, Boise, ID (US); Chris M. Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 422 days.

(21) Appl. No.: 17/158,859

(22) Filed: Jan. 26, 2021

(65) Prior Publication Data
US 2022/0238547 A1    Jul. 28, 2022

(51) Int. Cl.
| | | |
|---|---|---|
| *H10B 43/27* | (2023.01) | |
| *H10B 41/10* | (2023.01) | |
| *H10B 41/27* | (2023.01) | |
| *H10B 43/10* | (2023.01) | |

(52) U.S. Cl.
CPC ............ *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/27; H10B 41/35; H10B 43/35
See application file for complete search history.

(56) References Cited

U.S. PATENT DOCUMENTS

| | | |
|---|---|---|
| 8,519,471 B2 | 8/2013 | Kuk et al. |
| 9,412,821 B2 | 8/2016 | Simsek-Ege et al. |
| 9,741,737 B1 | 8/2017 | Huang et al. |
| 9,825,048 B2 | 11/2017 | Cernea |
| 9,941,298 B2 | 4/2018 | Huang et al. |
| 10,134,758 B2 | 11/2018 | Zhu et al. |
| 10,229,909 B2 | 3/2019 | Tokumitsu et al. |

(Continued)

OTHER PUBLICATIONS

Caillat et al., 3DNAND GIDL—Assisted Body Biasing for Erase Enabling CMOS under Array (CUA) Architecture, Conference Paper—May 2017, 2017 IEEE International Memory Workshop (IMW). IEEE, 5 pages.

(Continued)

*Primary Examiner* — Bac H Au
(74) *Attorney, Agent, or Firm* — TraskBritt

(57) ABSTRACT

A microelectronic device includes a stack structure comprising a vertically alternating sequence of insulative structures and conductive structures arranged in tiers. At least one pillar, comprising a channel material, extends through the stack structure. A source region, below the stack structure, comprises a doped material. A vertical extension of the doped material protrudes upward to an interface with the channel material at elevation within the stack structure (e.g., an elevation proximate or laterally overlapping in elevation at least one source-side GIDL region). The microelectronic device structure may be formed by a method that includes forming a lateral opening through cell materials of the pillar, recessing the channel material to form a vertical recess, and forming the doped material in the vertical recess. Additional microelectronic devices are also disclosed, as are related methods and electronic systems.

25 Claims, 30 Drawing Sheets

(56) References Cited

U.S. PATENT DOCUMENTS

| | | |
|---|---|---|
| 10,418,379 B2 | 9/2019 | Huang et al. |
| 10,559,582 B2 | 2/2020 | Nishikawa et al. |
| 10,608,012 B2 | 3/2020 | Huang et al. |
| 10,784,273 B2 | 9/2020 | Howder et al. |
| 10,804,291 B1 * | 10/2020 | Rajashekhar .......... H10B 41/35 |
| 11,049,568 B1 * | 6/2021 | Yada ...................... H10B 43/27 |
| 11,177,280 B1 * | 11/2021 | Rajashekhar .......... H10B 41/10 |
| 2017/0148810 A1 * | 5/2017 | Kai ........................ H01L 23/535 |
| 2019/0103410 A1 | 4/2019 | Daycock et al. |
| 2019/0221577 A1 | 7/2019 | Lilak et al. |
| 2019/0287984 A1 * | 9/2019 | Yang .................. G11C 16/0466 |
| 2019/0371816 A1 | 12/2019 | Huang et al. |
| 2019/0385681 A1 | 12/2019 | Yun et al. |
| 2020/0066346 A1 | 2/2020 | Li et al. |
| 2020/0083245 A1 | 3/2020 | Fayrushin et al. |
| 2020/0144288 A1 * | 5/2020 | Kanamori ............. H01L 21/565 |
| 2020/0227429 A1 | 7/2020 | Ji et al. |
| 2020/0258574 A1 | 8/2020 | McNeil |
| 2021/0265385 A1 * | 8/2021 | Rajashekhar .......... H10B 43/27 |
| 2021/0335805 A1 * | 10/2021 | Kai ...................... H01L 29/7926 |
| 2022/0059454 A1 * | 2/2022 | Suwa ...................... H10B 41/27 |
| 2022/0109003 A1 * | 4/2022 | Nagahata ............... H10B 43/35 |
| 2022/0139949 A1 * | 5/2022 | Sharangpani .......... H10B 43/35 |
| | | 257/314 |
| 2022/0181348 A1 * | 6/2022 | Matsuno ................ H10B 43/40 |

OTHER PUBLICATIONS

Chandulo et al., Microelectronic Devices with Support Pillars Spaced Along a Slit Region Between Pillar Array Blocks, and Related Methods and Systems, filed Oct. 5, 2020, U.S. Appl. No. 17/063,101. 65 pages.

* cited by examiner

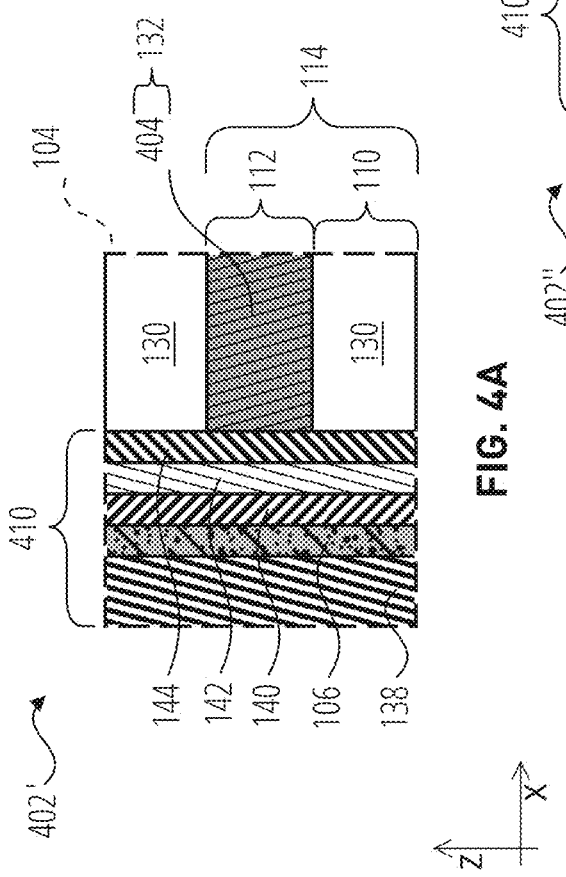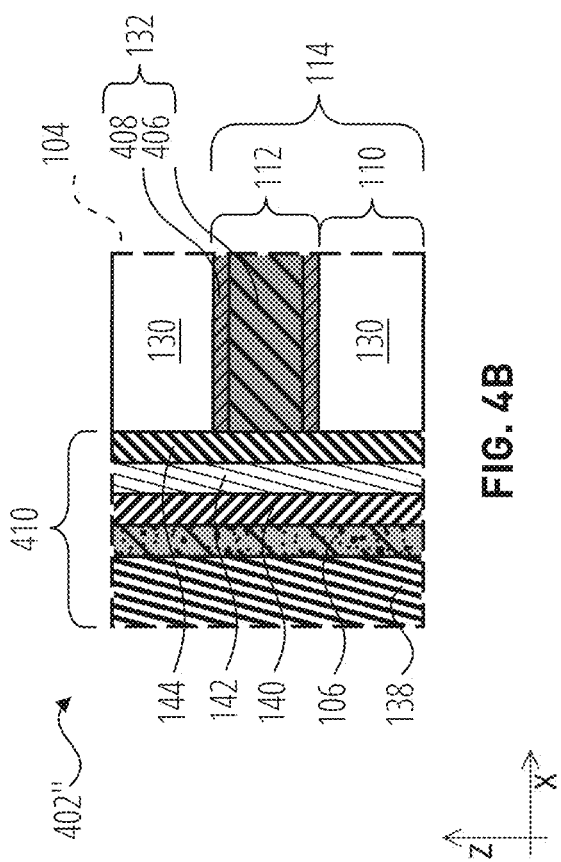

MICROELECTRONIC DEVICES WITH DOPANT EXTENSIONS NEAR A GIDL REGION BELOW A TIER STACK, AND RELATED METHODS AND SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers includes conductive materials vertically alternating with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of the memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

The channel structures of 3D NAND memory devices may be configured as so-called "hollow" channel structures, with a channel material laterally encircling a center or core of the pillar. Block-erasing the memory cells of such 3D NAND memory devices involves injecting holes (e.g., electron holes) into the channel material. For example, a conductive structure, gatedly connected to the hollow channel structure, may be used to provide gate-induced drain leakage (GIDL), generating the holes that can be swept into other parts of the hollow channel structure by an electronic field. Such a "GIDL" region may be otherwise referred to herein or in the art as a "select device." The gated connection, between the GIDL region and the hollow channel structure, may be facilitated by including a relatively higher level of doping, in the hollow channel structure near the GIDL region, than compared to elsewhere in the hollow channel structure. Thus, the GIDL region may generate holes in the hollow channel region to achieve block-erase of the memory cells.

Conventional 3D NAND structures have injected holes using a GIDL region proximate a drain region atop a tiered stack structure. However, as stacks are scaled upward to increase more tiers and more memory cells, the conventional one-sided (e.g., top-down) GIDL injection may not be functionally sufficient to ensure complete block-erase of a string of memory cells. Efforts have been made to include—in addition to an upper GIDL region, adjacent a drain region, for top-down injection of holes—a lower GIDL region, adjacent a source region, for bottom-up injection of holes. However, designing and fabricating such structures continues to present challenges.

BRIEF DESCRIPTION OF THE DRAWINGS

FIG. 4A and FIG. 4B are each a cross-sectional, elevational, schematic illustration of a memory cell, in accordance with embodiments of the disclosure, wherein the illustrated area corresponds to, e.g., box 104 of FIG. 1 and/or of FIG. 2.

FIG. 26 is a cross-sectional, elevational, schematic illustration of a microelectronic device structure, wherein a doped material of a source region includes vertical extensions protruding to elevations at or near an elevation of at least one lower GIDL region, in accordance with embodiments of the disclosure. The memory cells, and illustrated areas, of either or both of FIG. 4A and/or FIG. 4B may correspond to, e.g., the portion of FIG. 26 indicated by box 104.

DETAILED DESCRIPTION

Figure 1:
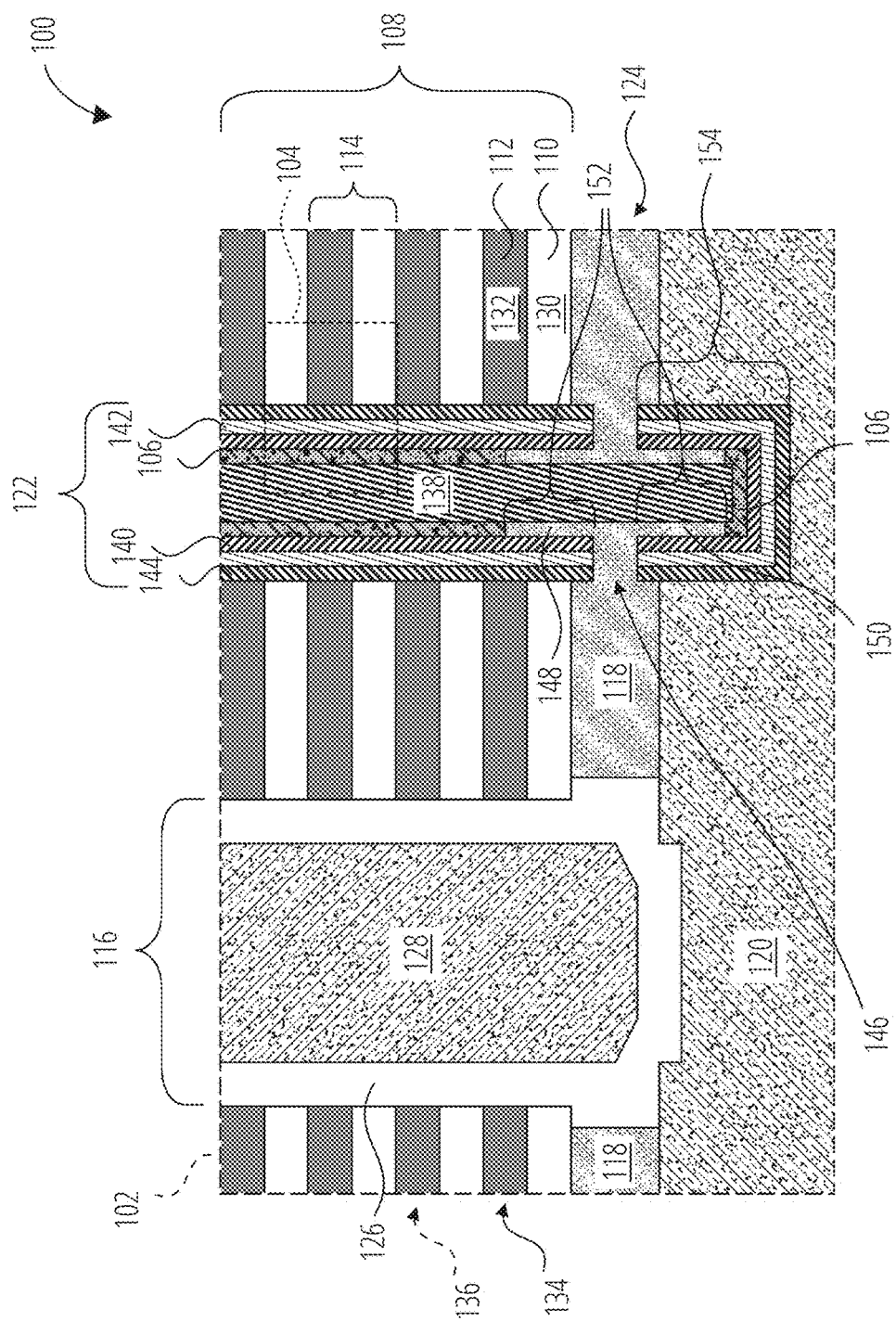
FIG. 1 is a cross-sectional, elevational, schematic illustration of a microelectronic device structure, wherein a doped material of a source region includes vertical extensions protruding to elevations at or near an elevation of at least one lower GIDL region, in accordance with embodiments of the disclosure.

Structures (e.g., microelectronic device structures), apparatus (e.g., microelectronic devices), and systems (e.g., electronic systems), in accordance with embodiments of the disclosure, include a stack of vertically alternating conductive structures and insulative structures arranged in tiers through which pillars vertically extend. A source region, comprising a doped material (e.g., a doped semiconductor material), is below the stack. The pillars extend through the doped material of the source region. The source region is formed in a manner that enables vertical extensions of the doped material to protrude upward, from the source region into lower elevations of the stack, to an elevation near or including a conductive structure configured as a gate-induced drain leakage (GIDL) region. The vertical extensions of doped material occupy vertical recesses formed in the channel material. The dopant (of the doped material) is, therefore, positioned in relatively close proximity to the GIDL region(s) and facilitates a reliable gated connection between the GIDL region and the channel material atop the doped material extension, providing a more reliable block-erase operation.

As used herein the terms "gate-induced drain leakage region" and "GIDL region" mean and include a conductive region (e.g., a conductive structure, a conductive tier) configured to generate—during a block-erase operation—holes (e.g., electron holes) in an adjacent channel material so that the holes can be swept into the channel material by an electronic field to cause erasing of the memory cells associated with the pillar that includes the channel material. Such GIDL region may be otherwise referred to herein or in the art as a "select gate" or "select device." When a GIDL region is adjacent a source region, the GIDL region may be otherwise referred to herein or in the art as a "source-side select device," a "source-gate select device," or an SGS device. When a GIDL region is adjacent a drain region, the GIDL region may be otherwise referred to herein or in the art as a "drain-side select device," a "drain-gate select device," or a SGD device.

As used herein, the terms "opening," "trench," "slit," "recess," and "void" mean and include a volume extending through or into at least one structure or at least one material, leaving a gap in that at least one structure or at least one material, or a volume extending between structures or materials, leaving a gap between the structures or materials. Unless otherwise described, an "opening," "trench," "slit," and/or "recess" is not necessarily empty of material. That is, an "opening," "trench," "slit," or "recess" is not necessarily void space. An "opening," "trench," "slit," or "recess" formed in or between structures or materials may comprise structure(s) or material(s) other than that in or between which the opening is formed. And, structure(s) or material(s) "exposed" within an opening, trench, slit, or recess is/are not necessarily in contact with an atmosphere or non-solid environment. Structure(s) or material(s) "exposed" within an opening, trench, slit, or recess may be adjacent or in contact with other structure(s) or material(s) that is/are disposed within the opening, trench, slit, or recess. In contrast, unless otherwise described, a "void" may be substantially or wholly empty of material. A "void" formed in or between structures or materials may not comprise structure(s) or material(s) other than that in or between which the "void" is formed. And, structure(s) or material(s) "exposed" within a "void" may be in contact with an atmosphere or non-solid environment.

As used herein, the terms "trench" and "slit" mean and include an elongate opening, while the terms "opening," "recess," and "void" may include either or both an elongate opening, elongate recess, or elongate void, respectively, and/or a non-elongate opening, a non-elongate recess, or non-elongate void, respectively.

As used herein, the terms "substrate" and "base structure" mean and include a base material or other construction upon which components, such as those within memory cells, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including one or more insulative materials.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The width of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The length of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the material or structure in question. For example, a "width" of a structure that is at least partially hollow, or that is at least partially filled with one or more other material(s), is the horizontal dimension between outermost edges or sidewalls of the structure, such as an outer "X"-axis diameter for a hollow or filled, cylindrical structure.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question. For example, a "length" of a structure that is at least partially hollow, or that is at least partially filled with one or more other material(s), is the horizontal dimension between outermost edges or sidewalls of the structure, such as an outer "Y"-axis diameter for a hollow or filled, cylindrical structure.

As used herein, the term "laterally overlapping," when referring to a relative disposition of at least two materials or structures, is a spatially relative term that means and includes at least one portion—of one of the at least two materials or structures—occupying at least one horizontal plane (e.g., an elevation, a level) also occupied by at least one portion of another of the at least two materials or structures. Therefore, one structure "laterally overlapping" a second structure includes the first structure having at least one portion that overlaps in elevation with at least one portion of the second structure. Materials or structures described as "laterally overlapping" (with no mention of "directly") may be either directly laterally overlapping or indirectly laterally overlapping. "Directly laterally overlapping" materials or structures are each in physical contact, with one or more of the others of the directly laterally overlapping materials or structures, in a respective region of direct lateral overlap. Accordingly, "directly laterally overlapping" materials or structures are in direct physical contact with one another at the elevations of the region of direct lateral overlap. "Indirectly laterally overlapping" materials or structures are physically spaced from one another in a respective region of indirect lateral overlap. Accordingly, "indirectly laterally overlapping" materials or structures are not in direct physical contact with one another at the elevations of the region of indirect lateral overlap.

As used herein, the term "vertically overlapping," when referring to a relative disposition of at least two materials or structures, is a spatially relative term that means and includes at least one portion—of one of the at least two materials or structures—occupying at least one vertical plane also occupied by at least one portion of another of the at least two materials or structures. Materials or structures described as "vertically overlapping" (with no mention of "directly") may be either directly vertically overlapping or indirectly vertically overlapping. "Directly vertically overlapping" materials or structures are each in physical contact, with one or more of the others of the directly vertically overlapping materials or structures, in a respective region of direct vertical overlap. "Indirectly vertically overlapping" materials or structures are physically spaced from one another in a respective region of indirect vertical overlap.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, is a spatially relative term that means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X lateral distance from a feature, despite the two structures being at different elevations along the feature. As another example, one structure having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. "Lower levels" and "lower elevations" are relatively nearer to the bottom-most illustrated surface of the respective structure, while "higher levels" and "higher elevations" are relatively further from the bottom-most illustrated surface of the respective structure. Unless otherwise specified, any spatially relative terms used in this disclosure are intended to encompass different orientations of the materials in addition to the orientation as depicted in the figures. For example, the materials in the figures may be inverted, rotated, etc., with the "upper" levels and elevations then illustrated proximate the bottom of the page and the "lower" levels and elevations then illustrated proximate the top of the page.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated, in elevational cross-sectional view, is a microelectronic device structure 100 that includes a stack structure 108 of vertically alternating (e.g., vertically interleaved) insulative structures 110 and conductive structures 112 arranged in tiers 114. Slit structures 116 extend through the stack structure 108, through a doped material 118, and to or into a base structure 120 to divide the stack structure 108 into blocks, as further discussed below. Pillars 122, including a channel material 106, also extend through the stack structure 108, through the doped material 118, and into the base structure 120.

The base structure 120 may be formed of and include, for example, a semiconductor material (e.g., polysilicon). The doped material 118, which is interposed between the base structure 120 and the stack structure 108, provides a source region 124 adjacent a lower end of the pillars 122. The doped material 118 may be formed of and include, for example, a semiconductor material (e.g., the semiconductor material of the base structure 120) doped with one of P-type conductivity materials (e.g., polysilicon doped with at least one P-type dopant (e.g., one or more of boron, aluminum, and/or gallium)) or N-type conductivity materials (e.g., polysilicon doped with at least one N-type dopant (e.g., one or more of arsenic, phosphorous, and/or antimony)).

The slit structure 116—extending through the stack structure 108, through the doped material 118, and to or into the base structure 120—may include an insulative liner 126 (e.g., formed of and including one or more insulative material(s)) and a nonconductive fill material 128 (e.g., any one or more of the aforementioned insulative material(s) and/or a semiconductive material, such as polysilicon). In some embodiments, sidewalls of the conductive structures 112 are laterally recessed, relative to the insulative structures 110, along the slit structure 116. In such embodiments, the insulative liner 126 laterally extends in correspondence with the lateral recesses of the conductive structures 112.

In the stack structure 108, the insulative structures 110 may be formed of and include at least one insulative material 130, such as an electrically insulative material that may be formed of and include any one or more of the insulative material(s) discussed above (e.g., a dielectric oxide material, such as silicon dioxide). In this and other embodiments described herein, the insulative material 130 of the insulative structures 110 may be the same or different than other insulative material(s) of the microelectronic device structure 100.

The conductive structures 112 of the stack structure 108 may be formed of and include one or more conductive materials 132, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), at least one conductively-doped semiconductor material (e.g., conductively-doped silicon, conductively-doped germanium, conductively-doped silicon germanium), polysilicon, and/or at least one other material exhibiting electrical conductivity. In some embodiments, the conductive structures 112 include at least one of the aforementioned electrically conductive materials along with at least one additional electrically conductive material formed as a liner.

One or more of the conductive structures 112 neighboring the source region 124 of the doped material 118 are configured as a GIDL region 134, such as a source-gate select device (e.g., a SGS device). In some embodiments, a single GIDL region (e.g., the GIDL region 134) is present adjacent the source region 124. In other embodiments, more than one GIDL region (e.g., the GIDL region 134 and one or more additional GIDL regions 136) are present adjacent the source region 124. One or more conductive structures 112 atop the stack structure 108 may also be configured as GIDL region(s), such as a drain-gate select device (e.g., a SGD device).

In the elevations of the stack structure 108 (e.g., elevations above the source region 124), the pillars 122 are laterally surrounded by the materials of the tiers 114 of the insulative structures 110 and the conductive structures 112. In elevations of the stack structure 108 at least above the GIDL region(s) (e.g., the GIDL region 134 and, if included, the additional GIDL regions 136), the channel material 106 may be interposed horizontally between an insulative material 138—forming a core of the pillar 122—and the tiers 114 of the stack structure 108. At least a portion of the channel material 106 is disposed vertically beneath the insulative material 138.

The insulative material 138 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 138 comprises silicon dioxide.

The channel material 106 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. The channel material 106 may be selected or otherwise formulated to have high mobility (e.g., a semiconductor material including one or more of a doped polysilicon, germanium (Ge), silicon germanium (SiGe), and/or gallium arsenide (GaAs)). In some embodiments, the channel material 106 includes a doped semiconductor material. The channel material 106 may be configured as a so-called "doped hollow channel" (DHC) structure.

The pillars 122 also include cell materials interposed horizontally between the channel material 106 and the tiers 114 of the stack structure 108. The cell materials may include a tunnel dielectric material 140 (also referred to as a "tunneling dielectric material"), which may be horizontally adjacent the channel material 106; a memory material 142, which may be horizontally adjacent the tunnel dielectric material 140; and a dielectric blocking material 144 (also referred to as a "charge blocking material"), which may be horizontally adjacent the memory material 142. In some embodiments, a dielectric barrier material is also horizontally interposed (e.g., directly horizontally interposed) between the dielectric blocking material 144 and the tiers 114 of the stack structure 108. The cell materials—including the tunnel dielectric material 140, the memory material 142, the dielectric blocking material 144, and, if present, the dielectric blocking material 144—also extend into the base structure 120 and below the insulative material 138. However, the cell materials do not extend continuously from the stack structure 108 into the base structure 120.

The tunnel dielectric material 140 may be formed of and include a dielectric material through which charge tunneling can be performed under suitable electrical bias conditions, such as through hot-carrier injection or by Fowler-Nordheim tunneling induced charge transfer. The tunnel dielectric material 140 may be formed of and include one or more of silicon oxide, silicon nitride, silicon oxynitride, dielectric metal oxides (e.g., aluminum oxide and hafnium oxide), dielectric metal oxynitride, dielectric metal silicates, alloys thereof, and/or combinations thereof. In some embodiments, the tunnel dielectric material 140 comprises silicon dioxide or silicon oxynitride.

The memory material 142 may comprise a charge trapping material or a conductive material. The memory material 142 may be formed of and include one or more of silicon nitride, silicon oxynitride, polysilicon (e.g., doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 142 comprises silicon nitride.

The dielectric blocking material 144 may be formed of and include one or more dielectric materials, such as, for example, one or more of an oxide (e.g., silicon dioxide), a nitride (e.g., silicon nitride), an oxynitride (e.g., silicon oxynitride), or another material. The material(s) of the dielectric blocking material 144 may be formed as one or more distinctive material regions (e.g., layers). In some embodiments, the dielectric blocking material 144 comprises a single material region, which may be formed of and include silicon oxynitride. In other embodiments, the dielectric blocking material 144 comprises a structure configured as an oxide-nitride-oxide (ONO) structure, with a series of material regions (e.g., layers) formed of and including, respectively, an oxide (e.g., silicon dioxide), a nitride (e.g., silicon nitride), and an oxide again (e.g., silicon dioxide).

In some embodiments, the tunnel dielectric material 140, the memory material 142, and the dielectric blocking material 144 together may form a structure configured to trap a charge, such as, for example, an oxide-nitride-oxide (ONO) structure. In some such embodiments, the tunnel dielectric material 140 comprises silicon dioxide, the memory material 142 comprises silicon nitride, and the dielectric blocking material 144 comprises silicon dioxide.

In embodiments including a dielectric barrier material, it may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride).

A lateral opening 146 extends through the cell materials (e.g., the dielectric blocking material 144, the memory material 142, the tunnel dielectric material 140, and the dielectric barrier material, if present) and through the channel material 106. The doped material 118 of the source region 124 extends through the lateral opening 146; therefore, the doped material 118 extends laterally through the cell materials and the channel material 106. A sidewall of the doped material 118 may be in direct contact with the insulative material 138 at the core of the pillar 122. The insulative material 138 may form a unitary structure while the channel material 106 and the cell materials are separated into upper and lower portions above and below the doped material 118 (e.g., above and below the lateral opening 146), respectively.

The channel material 106 is vertically recessed both above and below the lateral opening 146, and the doped material 118 vertically extends upward and downward into recesses that are within the width (e.g., the diameter) of the pillar 122. These vertical extensions of the doped material 118 form an upper vertical extension 148 (extending upward to an elevation within the elevations of the stack structure 108, e.g., an elevation overlapping with, or nearly overlapping with, elevations of at least one of the GIDL regions, such as the GIDL region 134 and/or the additional GIDL region 136) and a lower vertical extension 150 (extending downward to an elevation within the elevations of the base structure 120). Both the upper vertical extension 148 and the lower vertical extension 150 are near the base of the pillar 122, adjacent the source region 124.

The channel material 106 is recessed a vertical recess height 152—and the doped material 118 is formed to fill the vertical recess height 152—above the lateral opening 146. Above the lateral opening 146, the channel material 106 interfaces with the doped material 118 at a level within elevations of the stack structure 108. Below the lateral opening 146, the channel material 106 interfaces with the doped material 118 at a level within elevations of the base structure 120.

In embodiments in which the doped material 118 comprises a doped polysilicon material and in which the channel material 106 comprises a doped polysilicon material, the interface between the doped material 118 and the channel material 106 may nonetheless be visually distinguishable, e.g., via electron microscopy. In these or other embodiments, the dopant composition and/or dopant concentration in the doped material 118 may be different than the dopant composition and/or dopant concentration in the channel material 106. For example, the dopant concentration in the doped material 118 may be greater than the dopant concentration in the channel material 106.

The channel material 106 is vertically recessed, and the doped material 118 includes vertically-extending portions (e.g., the upper vertical extension 148, the lower vertical extension 150) so that the doped material 118 vertically extends to a level (e.g., elevation) near or at a level (e.g., elevation) of at least one source-side GIDL region(s). The upper vertical extension 148 may extend to a level that is within a range of about 10 nm below (e.g., about 5 nm below) a lowest surface of the lowest source-side GIDL region (e.g., the GIDL region 134, which may be the lowest conductive structure 112 of the stack structure 108) to about even with an upper surface of the upper most source-side GIDL region (e.g., the additional GIDL region 136, or the GIDL region 134 if only a single source-side GIDL region is included in the stack structure 108). Accordingly, in an embodiment in which only the single GIDL region 134 (e.g., only a single source-side, or lower, GIDL region) is included in the stack structure 108, the vertical recess height 152 may be in a range from about 10 nm less (e.g., within about 5 nm less), in vertical height, than the thickness of the lowest insulative structure 110 of the stack structure 108 to about the combined thickness of the lowest insulative structure 110 and the lowest conductive structure 112 of the stack structure 108. In embodiments in which multiple source-side GIDL regions are included, the vertical recess height 152 may not extend substantially above an upper surface of the uppermost of the source-side GIDL regions.

In some embodiments, the upper vertical extension 148 of the doped material 118 laterally overlaps some or all elevations of the GIDL region 134 (e.g., at least the lowest conductive structure 112 of the stack structure 108). For example, according to the embodiment illustrated in FIG. 1, the channel material 106 is vertically recessed to, and the upper vertical extension 148 of the doped material 118 extends to, a height of about a middle elevation of the GIDL region 134 (e.g., the lowest conductive structure 112 of the stack structure 108); therefore, the doped material 118 laterally overlaps a portion of the GIDL region 134.

Below the lateral opening 146, the lower vertical extension 150 of the doped material 118 may have a height about equal to the vertical recess height 152 of the upper vertical extension 148. As discussed further below, the recessing of the channel material 106 may be controlled so that at least some of the channel material 106 remains below (e.g., underneath) the insulative material 138 at the core of the pillar 122. A depth 154 of the cell materials of the pillars 122 below the lateral opening 146 may also be controlled to ensure at least some of the channel material 106 remains underneath the insulative material 138 at the core of the pillar 122. In some embodiments, the depth 154 (e.g., the pillar depth below the lateral opening 146) is in a range of from about three times (3×) to about four times (4×) the vertical recess height 152. Below the lateral opening 146, the cell materials and/or the channel material 106 may define a cross-sectional "U" shape.

The upper vertical extension 148 of the doped material 118 disposes a relatively greater concentration of dopant—in or from the doped material 118, compared to a dopant concentration in or from, e.g., the channel material 106—proximate the GIDL region(s) than would be disposed by the channel material 106 remaining proximate the GIDL region(s). The upper vertical extension 148 of the doped material 118 also disposes the relatively greater concentration of dopant proximate the GIDL region(s) without, in some embodiments, substantial out-diffusion of dopant from the doped material 118 into surrounding materials. Accordingly, the upper vertical extension 148 of the doped material 118 facilitates a reliable functional (e.g., gated) communication between the proximate GIDL region(s) (e.g., the GIDL region 134 or the GIDL region 134 and the additional GIDL regions 136, in embodiments with more than one source-side GIDL region) and the channel material 106. During a block-erase operation, the source-side GIDL region(s) (e.g., the GIDL region 134 or the GIDL region 134 and the additional GIDL regions 136) induce formation of the holes (e.g., the electron holes) in the channel material 106—while drain-side GIDL region(s) do likewise atop the channel material 106—to reliably erase the memory cells that are along the pillars 122, even when such pillars 122 pass through numerous tiers 114 (and therefore numerous conductive structures 112) of the stack structure 108.

The number (e.g., quantity) of tiers 114 (and conductive structures 112 and insulative structures 110) illustrated in the stack structure 108 of FIG. 1 may constitute only a lower portion of a much taller stack structure that includes many additional tiers 114 of the conductive structures 112 and the insulative structures 110. In some embodiments, a number (e.g., quantity) of the tiers 114 of the stack structure 108—and therefore the number (e.g., quantity) of conductive structures 112 in the stack structure 108—may be within a range of from thirty-two of the tiers 114 (and of the conductive structures 112) to three-hundred, or even more, of the tiers 114 (and of the conductive structures 112). In some embodiments, the stack structure 108 includes one-hundred twenty-eight of the tiers 114 (and of the conductive structures 112). However, the disclosure is not so limited, and the stack structure 108 may include a different number of the tiers 114 (and of the conductive structures 112).

The stack structure 108 may be formed in one or more decks, with each of the decks including a vertically alternating sequence of the insulative structures 110 and the conductive structures 112 arranged in the tiers 114. For example, the microelectronic device structure 100 of FIG. 1 may be only a portion of a microelectronic device structure 200 illustrated in FIG. 2, and the microelectronic device structure 200 may form the stack structure 108 in two parts (e.g., two decks), a lower deck 202 and an upper deck 204. In other embodiments, the stack structure 108 may include more than two decks.

The pillars 122 extend substantially vertically through each of the decks (e.g., the lower deck 202 and the upper deck 204) of the stack structure 108, as well as through the doped material 118 and into the base structure 120. In some embodiments, the materials of the pillars 122 (e.g., the insulative material 138 of the core, the channel material 106, and the cell materials that include the tunnel dielectric material 140, the memory material 142, and the dielectric blocking material 144 (FIG. 1)) are formed as material regions extending continuously (e.g., seamlessly and/or without distinctive portions) through the upper deck 204 and the lower deck 202 to the lateral opening 146 (FIG. 1). In other embodiments, the materials of the pillars 122 are separately formed in the upper deck 204 and the lower deck 202 such that separately-formed material regions interface proximate an interdeck portion 206. In some embodiments, the vertically alternating sequence of the conductive structures 112 and the insulative structures 110 of the tiers 114 (FIG. 1) may be interrupted, proximate the interdeck portion 206, by one or more other structures, such as an interdeck dielectric region that may be significantly thicker than any individual one of the insulative structures 110 of the tiers 114.

The slit structures 116, extending through the stack structure 108 (e.g., through all decks, including the upper deck 204 and the lower deck 202) divide the pillars 122 into blocks 208. Each of the blocks 208 may include an array of the pillars 122, and the sequence of blocks 208 may form a pillar array portion 210 of the microelectronic device structure 200.

Laterally adjacent the pillar array portion 210, either with or without intervening features, may be one or more staircase portions 212 that include staircase structure(s) having steps defined by lateral ends of at least some of the tiers 114 (FIG. 1). Operative, electrical contacts may be included in the staircase portion 212 to form electrical connection to the various conductive structures 112 (FIG. 1) of the stack structure 108. The doped material 118, as well as the base structure 120, may extend from the pillar array portion 210 to the staircase portion 212.

The microelectronic device structure 200 may further include, below or in the base structure 120, additional features. For example, bit lines and bit contacts may be formed in the base structure 120 (e.g., in the pillar array portion 210) to be in operable communication with the pillars 122 and/or other electrical features of the microelectronic device structure 200. Additional conductive lines and contacts may be also be included above, e.g., the upper deck 204, for electrical connection of the pillars 122 and/or other features of the microelectronic device structure 200. In some embodiments, CMOS (complementary metal-oxide-semiconductor) circuitry is included in a CMOS region 214 below the pillars 122 of the pillar array portion 210. In such embodiments, the microelectronic device structure 200 may be characterized as having a so-called "CMOS under Array" ("CuA") region.

Figure 2:
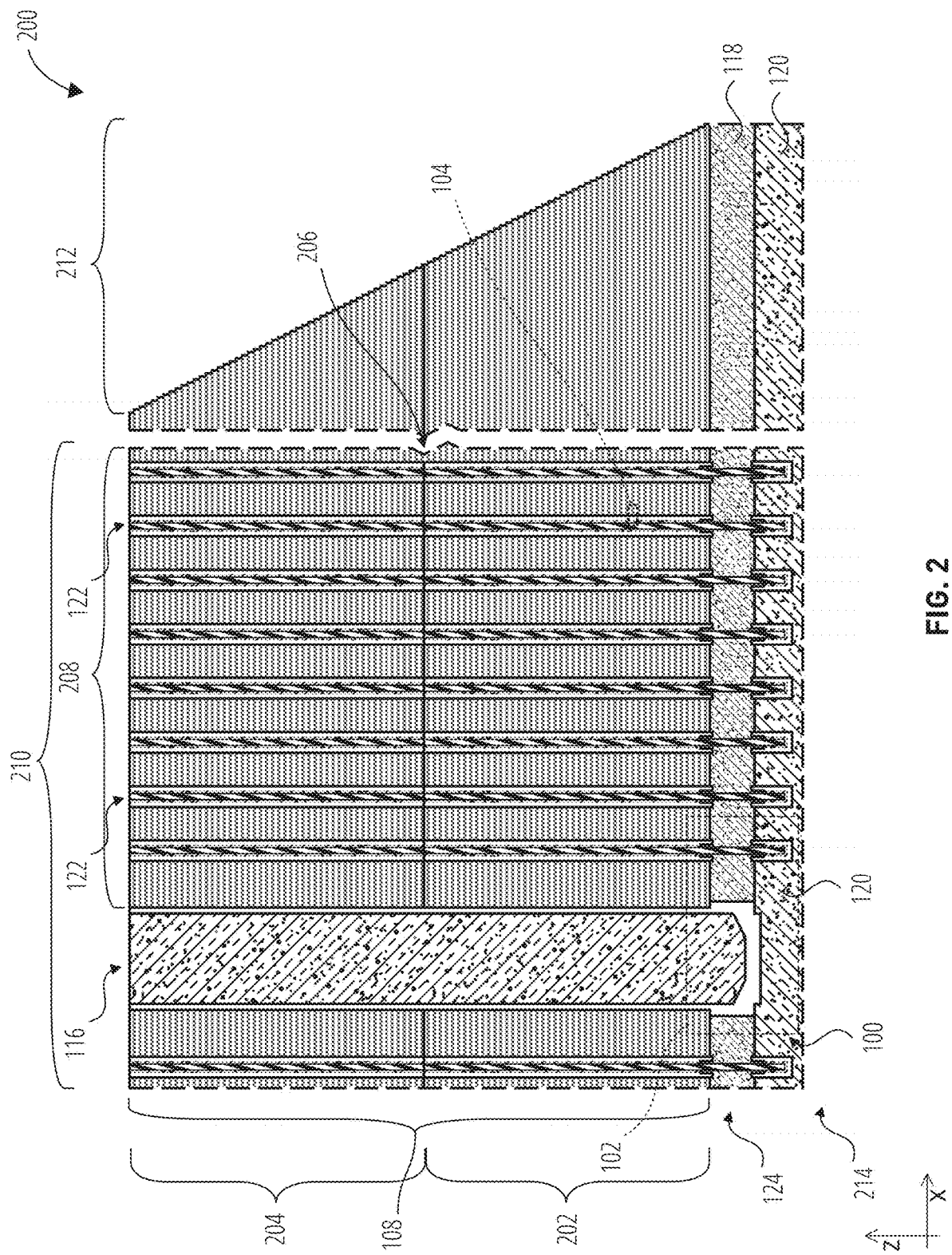
FIG. 2 is a cross-sectional, elevational, schematic illustration of a microelectronic device structure that may include the microelectronic device structure of FIG. 1, such that the illustration of FIG. 1 is an enlarged view corresponding to box 102 of FIG. 2, in accordance with embodiments of the disclosure.
Figure 3:
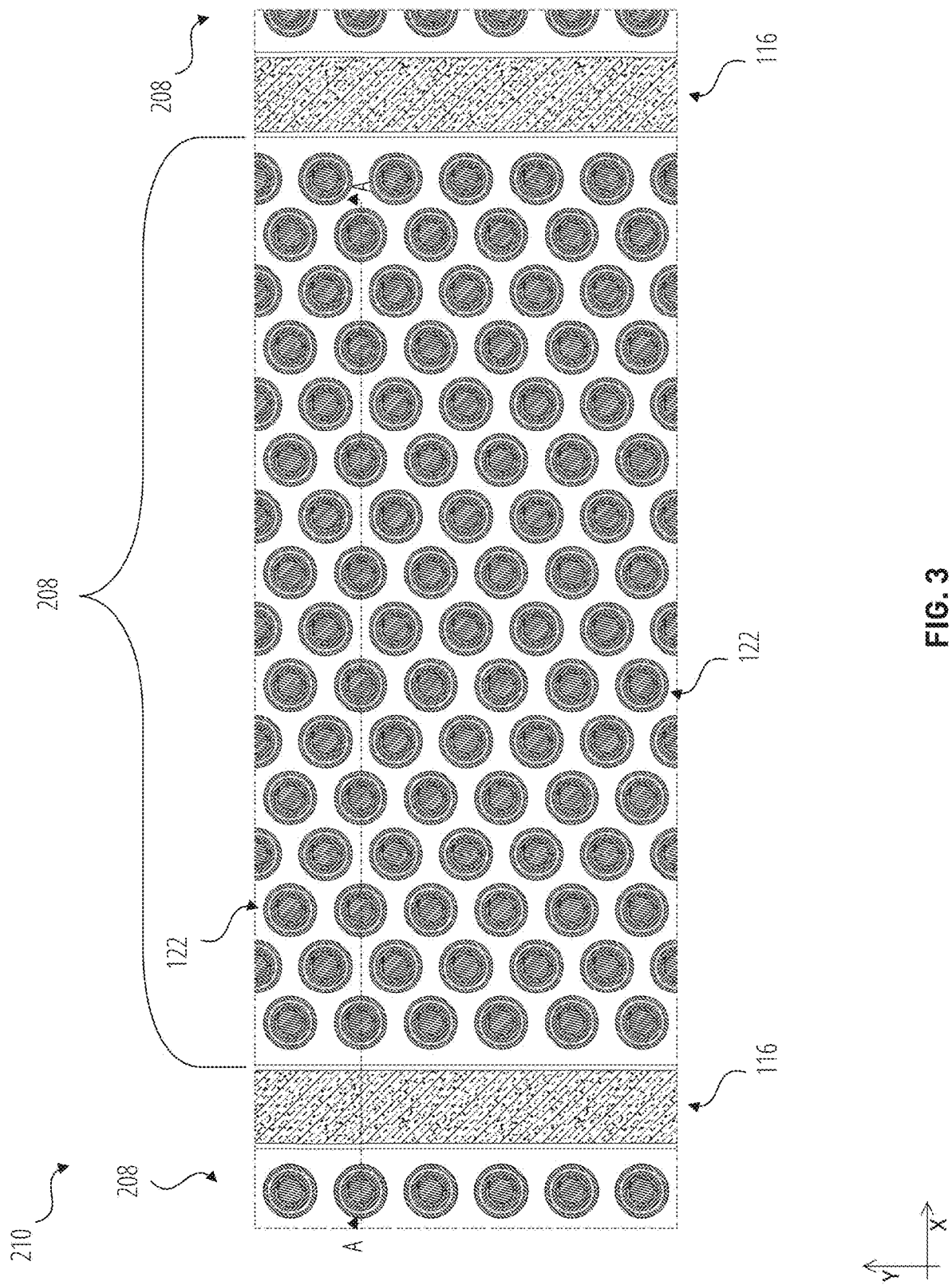
FIG. 3 is a top plan, schematic illustration of the microelectronic device structure of FIG. 2, wherein the view of FIG. 2 is taken along section line A-A of FIG. 3, in accordance with embodiments of the disclosure.

FIG. 3 illustrates, from a top-view perspective, one of the blocks 208 that includes an array of the pillars 122. One block 208 is bordered, at its left and right lateral sides, by one of a pair of the slit structures 116. Additional blocks 208 may be disposed across the slit structures 116. In such a structure as that illustrated in FIG. 3, the pillar array portion 210 of FIG. 2 may be a cross-sectional view taken along section line A-A of FIG. 3. The staircase portion 212 of FIG. 2, which portion is not illustrated in the structure portion illustrated in FIG. 3, may be laterally disposed relative to that which is illustrated in FIG. 3.

In the discussions herein, descriptions of one pillar 122 may equally apply to any or all of the pillars 122 of one or more blocks 208 of a microelectronic device structure of any embodiment of this disclosure (e.g., the microelectronic device structure 100 of FIG. 1, the microelectronic device structure 200 of FIG. 2, etc.). Accordingly, some or all of the pillars 122 may have substantially the same materials and structures.

The pillars 122 may effectuate the formation of strings of memory cells of a memory device (e.g., a memory device including the microelectronic device structure 100 of FIG. 1, the microelectronic device structure 200 of FIG. 2 and FIG. 3, and/or any other microelectronic device structure described or illustrated herein). With reference to FIG. 4A and FIG. 4B, illustrated, in enlarged elevational cross-sectional view, are memory cells 402 (e.g., memory cell 402' of FIG. 4A and memory cell 402" of FIG. 4B) that may be provided in the microelectronic device structure 100 of FIG. 1, the microelectronic device structure 200 of FIG. 2, and/or any other microelectronic device structure that include box 104. Each of the illustrations of FIG. 4A and FIG. 4B may represent a simplified enlarged view of box 104 of FIG. 1, FIG. 2, and/or other figures discussed below. Reference herein to one "memory cell 402" or multiple "memory cells 402" equally refers to one or multiple of any of the illustrated memory cell 402' of FIG. 4A and/or the illustrated memory cell 402" of FIG. 4B.

The memory cells 402 are in the vicinity of at least one of the tiers 114, with at least one of the insulative structures 110 vertically adjacent at least one of the conductive structures 112. In some embodiments, such as that illustrated in FIG. 4A, the conductive material(s) 132 of the conductive structures 112 consist essentially of, or consist of, a single conductive material or a homogenous combination of conductive materials either of which is represented by a conductive material 404 illustrated in FIG. 4A. The conductive material 404 may be directly adjacent the insulative material 130 of the insulative structure 110, e.g., without a distinguishable conductive liner.

In other embodiments, such as that illustrated in FIG. 4B, the conductive material(s) 132 of some or all of the conductive structures 112 may include a conductive metal 406 surrounded at least in part by a conductive liner material 408. The conductive liner material 408 may be directly adjacent upper and lower surfaces of neighboring insulative structures 110, respectively. The conductive metal 406 may be directly vertically between portions of the conductive liner material 408.

Memory cells 402" having the structure of FIG. 4B may be formed by a so-called "replacement gate" process, discussed further below. The conductive liner material 408 may comprise, for example, a seed material that enables formation of the conductive metal 406 during the replacement-gate process. The conductive liner material 408 may be formed of and include, for example, a metal (e.g., titanium, tantalum), a metal nitride (e.g., tungsten nitride, titanium nitride, tantalum nitride), or another material. In some embodiments, the conductive liner material 408 comprises titanium nitride, and the conductive metal 406 comprises tungsten.

With continued reference to FIG. 4A and FIG. 4B, adjacent the tiers 114, with the insulative structures 110 and the conductive structures 112, are materials of one of the pillars 122 (e.g., FIG. 1) (partially illustrated, in FIG. 4A and FIG. 4B, as a pillar portion 410, which may be about half of the lateral width, e.g., the diameter, of the pillar 122). As illustrated in the pillar portion 410, each of the pillars 122 includes—at least above the upper vertical extension 148 of the doped material 118 (FIG. 1)—the channel material 106 and the cell materials (e.g., the tunnel dielectric material 140, the memory material 142, and the dielectric blocking material 144) that may each laterally surround the insulative material 138 at the core (e.g., the axial center) of the pillar 122 (FIG. 1).

In some embodiments of memory cells, such as with the memory cell 402' of FIG. 4A and the memory cell 402" of FIG. 4B, the channel material 106 may be horizontally interposed between the insulative material 138 and the tunnel dielectric material 140; the tunnel dielectric material 140 may be horizontally interposed between the channel material 106 and the memory material 142; and the memory material 142 may be horizontally interposed between the tunnel dielectric material 140 and the dielectric blocking material 144. In some such embodiments, the dielectric blocking material 144 is horizontally interposed between the memory material 142 and a dielectric barrier material (not illustrated), and the dielectric barrier material may be directly adjacent the conductive structure 112 and the insulative structure 110 of the tier 114. In other such embodiments, the dielectric blocking material 144 is directly horizontally interposed between the memory material 142 and the tier 114.

To effectuate the memory cell 402 (e.g., the memory cell 402' of FIG. 4A, the memory cell 402" of FIG. 4B), one of the conductive structures 112 laterally surrounds (e.g., encircles) the materials of the pillar 122 (e.g., FIG. 3). In embodiments corresponding to the memory cell 402' of FIG. 4A, the conductive material 404 laterally surrounds the materials of the pillar 122 (e.g., FIG. 3); whereas, in embodiments corresponding to the memory cell 402" of FIG. 4B, both the conductive metal 406 and the conductive liner material 408 laterally surround the materials of the pillar 122 (e.g., FIG. 3).

Accordingly, each of the pillars 122 (e.g., FIG. 2) may provide a string of memory cells 402 extending vertically, or at least partially vertically, through the stack structure 108 (FIG. 2), from the source region 124 (FIG. 2) to a drain region above the stack structure 108. At least one of the conductive structures 112 adjacent the source region 124, below the stack structure 108, is configured as a GIDL region (e.g., a source-side select device) while at least one of the conductive structures 112 adjacent the drain region, above the stack structure, is configured as another GIDL region (e.g., a drain-side select device).

Accordingly, disclosed is a microelectronic device comprising a stack structure. The stack structure comprises a vertically alternating sequence of insulative structures and conductive structures arranged in tiers. At least one pillar extends through the stack structure. The at least one pillar comprises a channel material. A source region, below the stack structure, comprises a doped material. A vertical extension of the doped material protrudes upward to an interface with the channel material at an elevation within the stack structure.

While forming a sufficient amount of dopant adjacent the upper, drain-side GIDL region may be relatively straight forward, forming a sufficient amount of dopant adjacent the lower, source-side GIDL region(s) is more challenging. By the methods described below, the source region 124 (FIG. 1, FIG. 2) is formed to include the upwardly-extending vertical projections (e.g., the upper vertical extensions 148 (FIG. 1)) so that the doped material 118 (FIG. 1) is disposed near or laterally overlapping with at least one lower, source-side GIDL region to facilitate a reliable gated connection between the GIDL region and the channel material 106 that interfaces with the doped material 118.

With reference to FIG. 5 through FIG. 15, illustrated are various stages for forming a microelectronic device, such as one including the microelectronic device structure 100 of FIG. 1 and/or the microelectronic device structure 200 of FIG. 2.

Figure 5:
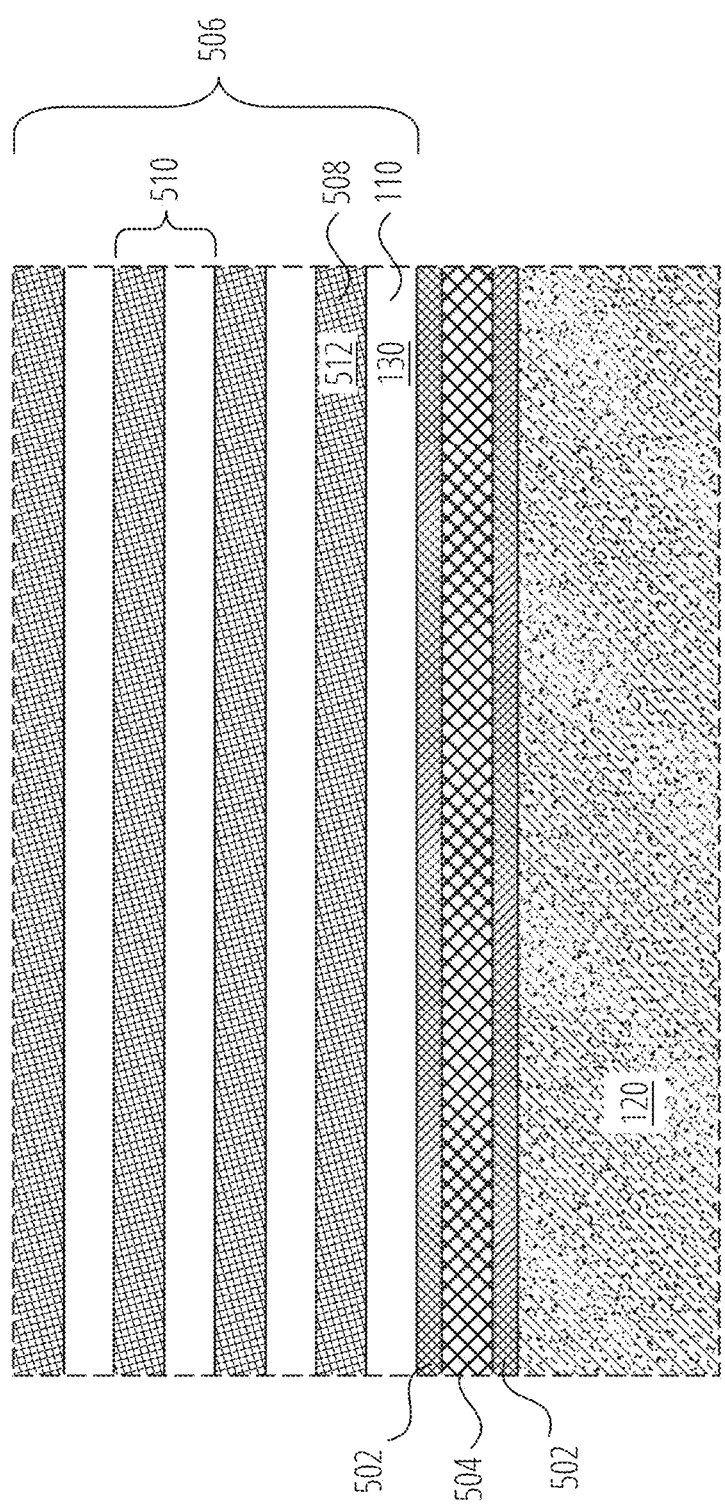
FIG. 5 through FIG. 15 are cross-sectional, elevational, schematic illustrations of various stages of processing to fabricate the microelectronic device structures of FIG. 1 through FIG. 3, in accordance with embodiments of the disclosure.

With reference to FIG. 5, a sacrificial structure with a sequence (e.g., "sandwich" structure) of different sacrificial materials is formed on the base structure 120 in the elevations that will eventually become the source region 124 (FIG. 1). A region (e.g., layer) of a first sacrificial material 502 may be formed (e.g., deposited) on an upper surface of the base structure 120, a region (e.g., layer) of a second sacrificial material 504 may be formed (e.g., deposited) on the first sacrificial material 502, and an additional region (e.g., layer) of the first sacrificial material 502 may be formed on the second sacrificial material 504.

Each of the first sacrificial material 502 regions may be formed to a thickness in a range from about 10 nm to about 40 nm. The region of the second sacrificial material 504 may be formed to a thickness in a range from about 30 nm to about 60 nm. The thickness of the second sacrificial material 504 may subsequently define a height of the lateral opening 146 (FIG. 1). Therefore, the thickness of the second sacrificial material 504 may be tailored to facilitate forming the lateral opening 146 with a sufficient height to facilitate subsequent recess formation and recess filing acts. A thickness of the sacrificial sandwich structure (e.g., a combined thickness of the lower region of the first sacrificial material 502, the region of the second sacrificial material 504, and the upper region of the first sacrificial material 502) may correspond to the thickness of the source region 124 (e.g., the doped material 118 to be formed between the base structure 120 and the stack structure 108 (FIG. 1)).

The first sacrificial material 502 and the second sacrificial material 504 may be selected or otherwise formulated so that the second sacrificial material 504 is selectively removable (e.g., selectively etchable) relative to the first sacrificial material 502. The second sacrificial material 504 may further be selected or otherwise formulated to be selectively removable (e.g., selectively etchable) relative to the material of the base structure 120 (e.g., relative to semiconductor material such as polysilicon), and/or relative to insulative materials (e.g., oxides, nitrides, oxynitrides), such as in the dielectric blocking material 144. The first sacrificial material 502 may also be formulated or otherwise selected to be selectively removable (e.g., selectively etchable) relative to semiconductor material (e.g., of the base structure 120, of the channel material 106), and/or relative to insulative materials (e.g., of the insulative materials 130, of the dielectric blocking material 144, of the tunnel dielectric material 140, and/or other insulative or dielectric structures). In some embodiments, the first sacrificial material 502 may be formed of and include silicon carbon nitride (SiCN), and the second sacrificial material 504 may be formed of and include silicon germanium (SiGe). The stoichiometric ratio of the elements of the first sacrificial material 502 in the upper region may be the same or different than the stoichiometric ratio of elements of the first sacrificial material 502 in the lower region.

A stack structure 506 is formed on the upper region of the first sacrificial material 502. The stack structure 506 is formed to include a vertically alternating sequence of the insulative structures 110 and sacrificial structures 508 arranged in tiers 510. The sacrificial structures 508 may be formed at levels of the stack structure 506 that will eventually be replaced with or otherwise converted into the conductive structures 112 (FIG. 1).

The sacrificial material 512 of the sacrificial structures 508 may be selected or otherwise formulated to be selectively removable (e.g., selectively etchable) relative to the insulative material 130 of the insulative structures 110. In some embodiments, the insulative material 130 comprises silicon dioxide and the sacrificial material 512 comprises silicon nitride.

To form the stack structure 506, formation (e.g., deposition) of the insulative materials 130 of the insulative structures 110 may be alternated with formation (e.g., deposition) of the sacrificial material 512 of the sacrificial structures 508. In some embodiments, the stack structure 506 may be formed, at this stage, to include as many tiers 510 with sacrificial structures 508 as there will be tiers 114 (FIG. 1) of conductive structures 112 (FIG. 1) in all deck(s) (e.g., the lower deck 202, the upper deck 204 (FIG. 2)) of the microelectronic device structure being fabricated (e.g., the microelectronic device structure 200 of FIG. 2). In other embodiments, only the tiers 114 of the lower deck 202 are formed at this stage, and the subsequent stages illustrated in FIG. 5 through FIG. 15 may be carried out only in or for the lower deck 202, prior to fabricating the upper deck 204.

Figure 6:
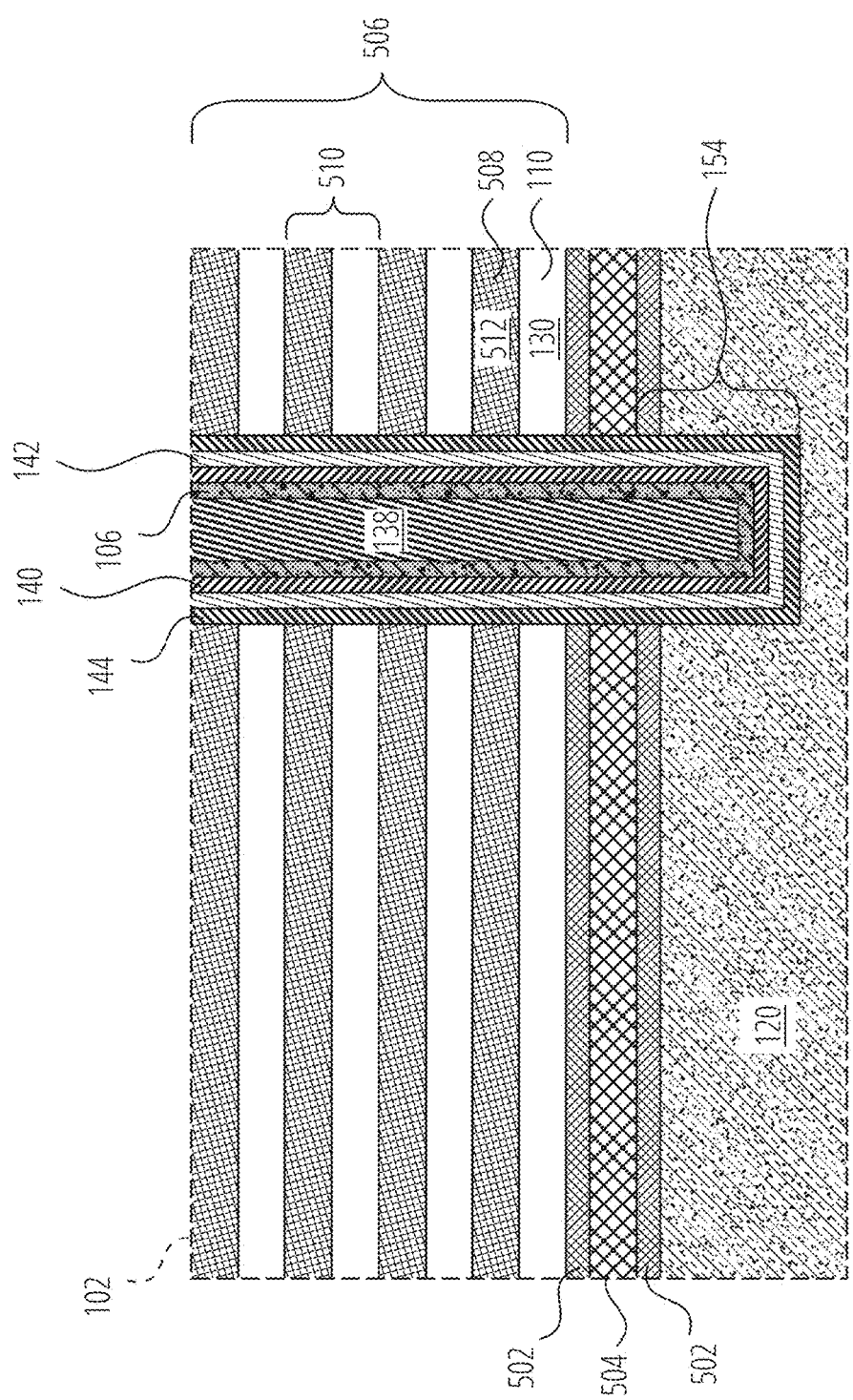

With reference to FIG. 6, pillar openings may be formed (e.g., etched) through the stack structure 506, through the sandwich structure of the first sacrificial material 502 and the second sacrificial material 504, and into the base structure 120. The arrangement of the pillar openings may correspond to the arrangement of the pillars 122 (FIG. 3) to be formed in the pillar array portion 210 (FIG. 3).

The pillar openings may be formed to a depth, into the base structure 120, controlled or otherwise tailored to define—from a base of the pillar opening to an upper surface of the lower region of the first sacrificial material 502—the depth 154 of the U-shaped cell material structure that will remain under the insulative material 138 core of the pillars 122 (FIG. 1) after forming the lateral opening 146 (FIG. 1), the channel material 106 recesses, and the lower vertical extension 150 (FIG. 1) of the doped material 118 (FIG. 1). Accordingly, the thickness of the first sacrificial material 502, of at least the lower region of the first sacrificial material 502, may also be tailored to facilitate forming a sufficiently deep U-shaped cell material structure to ensure a sufficient amount of channel material 106 remains under the insulative material 138 after recessing the channel material 106, described further below.

Within each of the pillar openings, the cell materials (e.g., the dielectric barrier material, if any, the dielectric blocking material 144, the memory material 142, and the tunnel dielectric material 140) may be formed (e.g., conformally deposited) in sequence. The channel material 106 may be formed (e.g., conformally deposited) on the cell materials (e.g., on the tunnel dielectric material 140). The insulative material 138 may be formed (e.g., deposited) to fill remaining space defined by the channel material 106.

Figure 7:
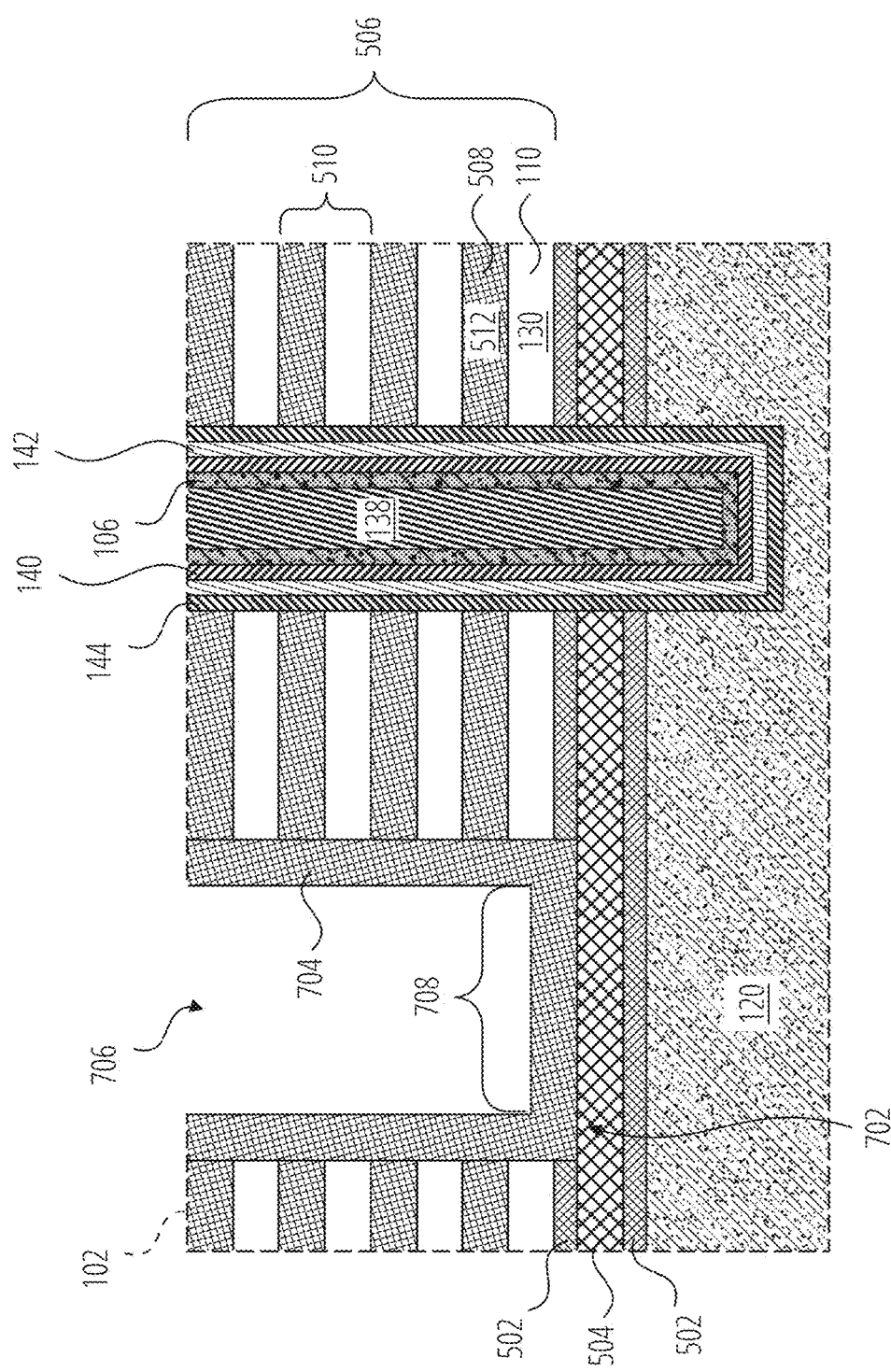

With reference to FIG. 7, a slit 702 is formed (e.g., etched) for each slit structure 116 (FIG. 1) to be formed in the microelectronic device structure (e.g., the microelectronic device structure 100 of FIG. 1, the microelectronic device structure 200 of FIG. 2 and/or FIG. 3). The slits 702 are formed to extend through the stack structure 506 and through the upper region of the first sacrificial material 502 to expose, at a base of the slit 702, the second sacrificial material 504 (e.g., an upper surface of the second sacrificial material 504). Some portion of the second sacrificial material 504 may or may not also be removed to form the slits 702. However, at least some portion of the second sacrificial material 504 remains so that the lower region of the first sacrificial material 502 is not exposed in the slits 702.

Figure 8:
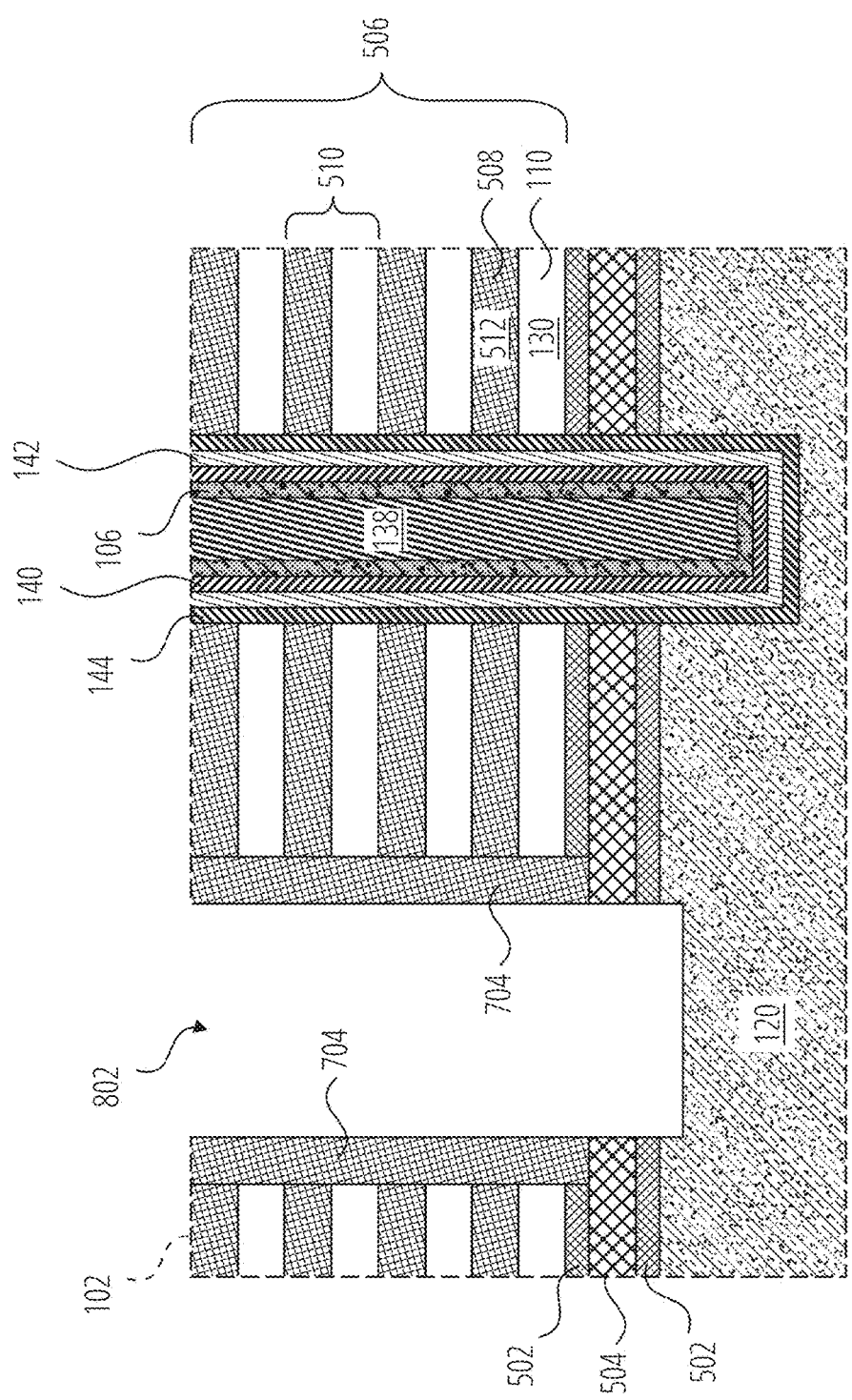

A sacrificial liner 704 is formed (e.g., conformally formed, deposited) to line the slits 702, forming a lined slit 706. The sacrificial liner 704 may be formed of and include a nitride material (e.g., silicon nitride). A base portion 708 may be removed (e.g., etched) without substantially removing sidewall portions of the sacrificial liner 704, as illustrated in FIG. 8, so that the sacrificial liner 704 remains to cover sidewalls of the tiers 510 of the stack structure 506.

In some embodiments, while or after etching through the base of the sacrificial liner 704, the etching is continued (e.g., by dry etching) into or wholly through the second sacrificial material 504. In some such embodiments, the lower region of the first sacrificial material 502 and, optionally, a portion of the base structure 120 may also be removed, as illustrated in FIG. 8. A resulting extended slit 802 exposes the second sacrificial material 504 and the lower region of the first sacrificial material 502 in the extended slit 802 without exposing the tiers 510 of the stack structure 506.

In other embodiments, the extended slit 802 may be formed to a depth terminating at or partially into the second sacrificial material 504 so that the lower region of the first sacrificial material 502 is not exposed in the extended slit 802.

Figure 9:
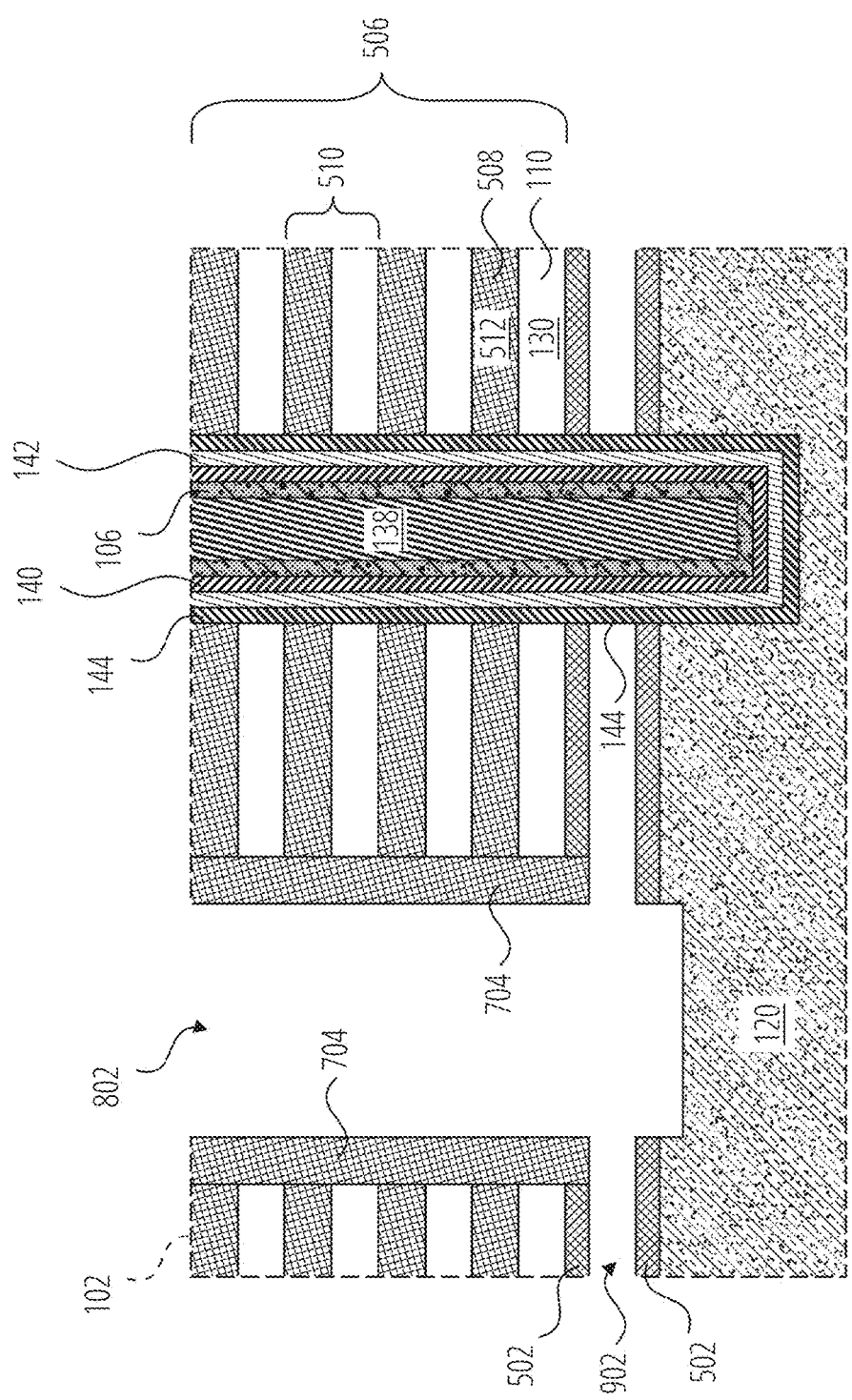

The second sacrificial material 504 may be removed (e.g., exhumed) via the extended slit 802 without substantially removing the sacrificial liner 704, the first sacrificial material 502, and the outer material of the cell materials (e.g., the dielectric blocking material 144), as illustrated in FIG. 9. In embodiments in which the second sacrificial material 504 (FIG. 8) was formed of and includes SiGe, the second sacrificial material 504 may be selectively removed by, for example, a "wet" etchant chemistry comprising, consisting essentially of, or consisting of, e.g., a mixture of hydrogen fluoride (HF), hydrogen peroxide ($H_2O_2$), and acetic acid ($CH_3COOH$) or, for another example, by a "dry" etch chemistry comprising, consisting essentially of, or consisting of, e.g., a mixture of vapor-phase hydrochloric acid (HCl(g)) in a epitaxy reactor. In other embodiments, other etch chemistries or selective material-removal techniques may be used.

Selectively removing the second sacrificial material 504 (FIG. 8) forms a void 902 vertically interposed between the regions of the first sacrificial material 502 and exposing an exterior sidewall of the outer cell materials (e.g., the dielectric blocking material 144). In embodiments in which the extended slit 802 was formed to extend fully through the first sacrificial material 502, the void 902 also exposes a portion of the base structure 120.

Figure 10:
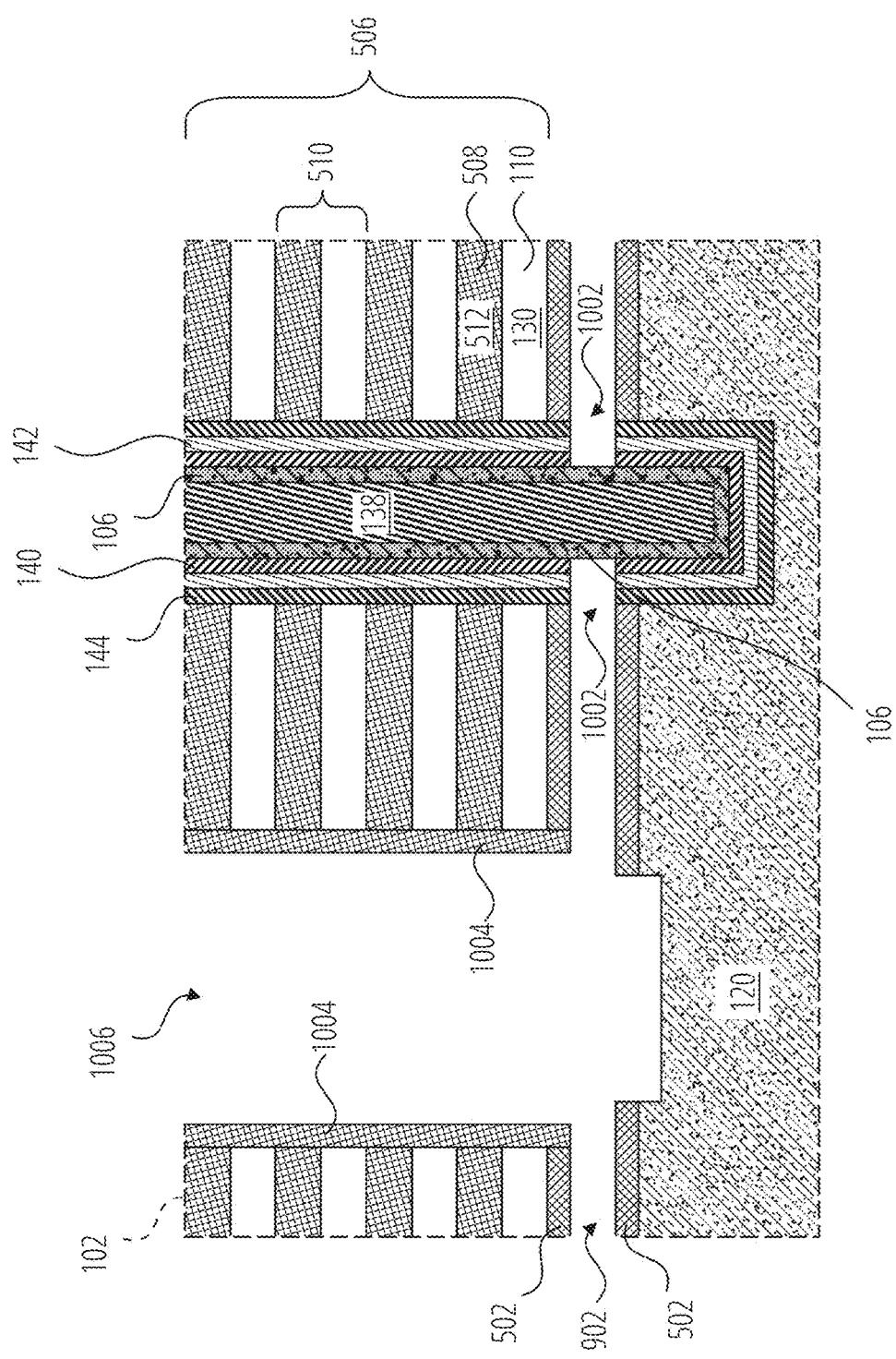
Figure 11:
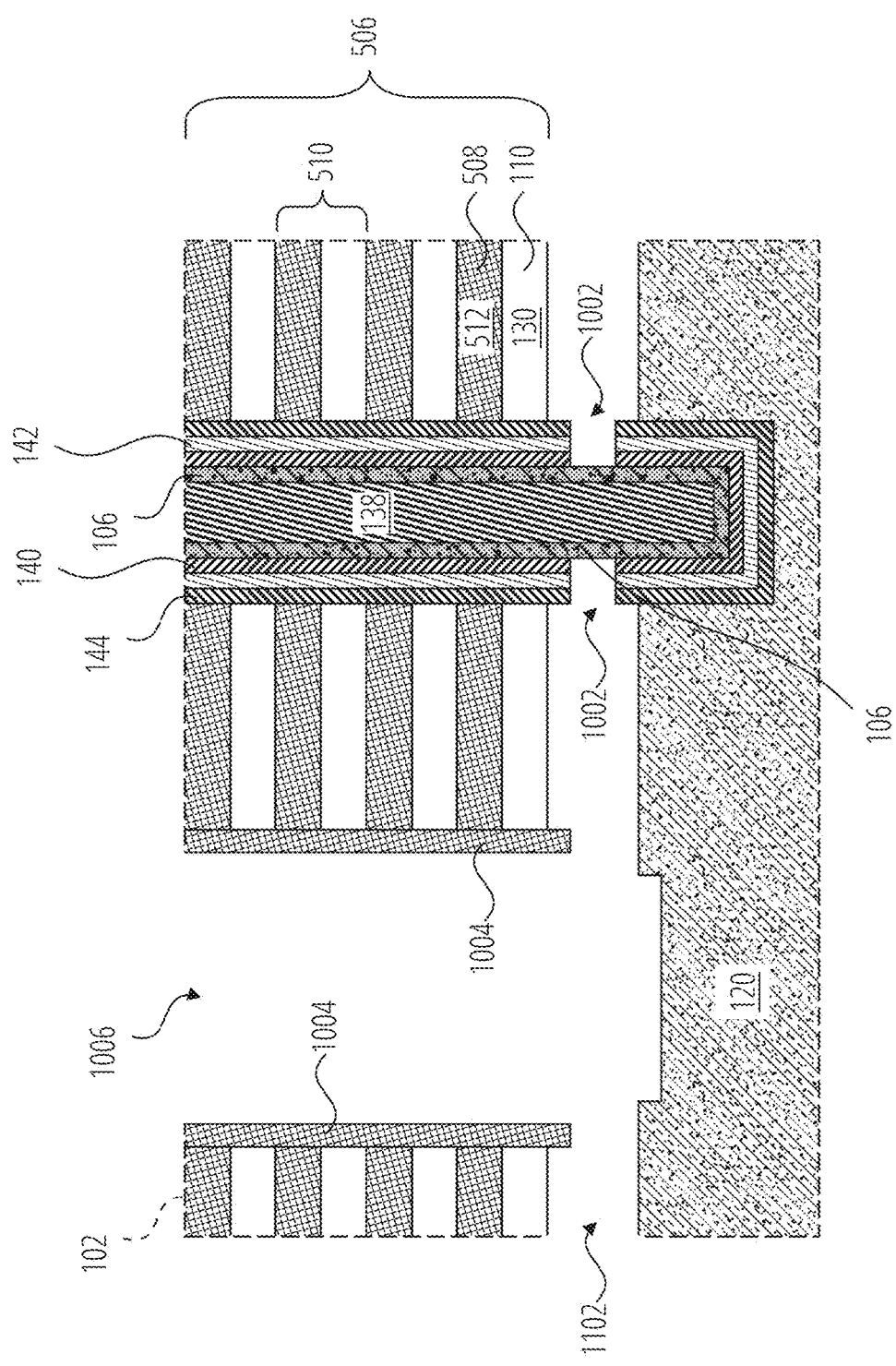

With reference to FIG. 10, the cell materials (e.g., the dielectric blocking material 144, the memory material 142, and the tunnel dielectric material 140) are etched (e.g., by wet etching, by dry etching) via the void 902 to form a lateral expansion 1002. In some embodiments, the removal (e.g., etching) of the cell materials may be a continuation of the etching process to remove the second sacrificial material 504 (FIG. 8). The lateral expansion 1002 exposes an outer sidewall of the channel material 106.

In some embodiments, the cell materials may be laterally etched selective to the material of the base structure 120 and the channel material 106 (e.g., polysilicon). The lateral expansion 1002 may be formed by performing a sequence of etching acts, including an oxide-removal act (e.g., to etch the dielectric blocking material 144), a nitride-removal act (e.g., to etch the memory material 142), and another oxide-removal act (e.g., to etch the tunnel dielectric material 140).

Forming the lateral expansion 1002 may vertically recess one, more, or all of the cell materials relative to other(s) of the cell materials, relative to the first sacrificial material 502, relative to the lowest insulative structure 110 of the stack structure 506, and/or relative to the base structure 120. Therefore—though FIG. 10 illustrates upper and lower surfaces of the cell materials (e.g., the dielectric blocking material 144, the memory material 142, the tunnel dielectric material 140) as being substantially coplanar with upper and lower surfaces of the lower and upper regions of the first sacrificial material 502, respectively—the disclosure is not so limited. The thickness to which the upper region of the first sacrificial material 502 was formed may be tailored to ensure the etching of the cell materials does not expose the sacrificial material 512 of the lowest sacrificial structure 508 to the etchant. The thickness to which the upper region of the first sacrificial material 502 was formed may also be tailored to ensure the insulative material 130 of the insulative structure 110 is not exposed to the etchant.

In some embodiments, forming the lateral expansion 1002 may—in a region proximate the lateral expansion 1002—horizontally thin one, more, or all of the cell materials relative to their respective lateral thicknesses prior to forming the lateral expansion 1002. Therefore—though FIG. 10 illustrates the horizontal thicknesses of the cell materials as being substantially similar to their respective horizontal thicknesses illustrated in FIG. 9—the disclosure is not so limited.

The etching acts to form the lateral expansion 1002 may also thin the material of the sacrificial liner 704 (FIG. 9). However, the thickness to which the sacrificial liner 704 was formed may have been tailored to ensure at least some of the sacrificial liner 704 remains, e.g., as a thinner sacrificial liner 1004, along sidewalls of a broader slit 1006, above the void 902, so that the tiers 510 of the stack structure 506 are not exposed to the etchant(s) used in forming the lateral expansion 1002.

After forming the lateral expansion 1002, the first sacrificial material 502 may be selectively removed (e.g., exhumed) to form a source region void 1102. As discussed above, the first sacrificial material 502 may have been selected or formulated to enable the first sacrificial material 502 to be selectively removed without substantially removing, e.g., oxide insulative materials (e.g., the insulative material 130 of the insulative structure 110) exposed in the source region void 1102.

In embodiments in which the first sacrificial material 502 was formed of and included SiCN and in which one or more of the cell materials (e.g., the memory material 142) included a nitride material, the first sacrificial material 502 may be removed while laterally removing the nitride material of the cell materials. In other embodiments, the first sacrificial material 502 may be removed after forming the lateral expansion 1002.

As described above, the first sacrificial material 502 (FIG. 8) and the second sacrificial material 504 (FIG. 8) may be selected or otherwise formulated so as to be selectively removable, with the second sacrificial material 504 being selectively removable relative to the first sacrificial material 502, and with the first sacrificial material 502 being selectively removable relative to oxide material (e.g., of the insulative structures 110 and of the cell materials). Accordingly, both the second sacrificial material 504 and the first sacrificial material 502 may be selectively removed without, at least in some embodiments, conversion processes (e.g., oxidation processes) to adjust the etchable selectivity of the materials. Avoiding such conversion processes, in these embodiments, may simplify the fabrication process.

Figure 12:
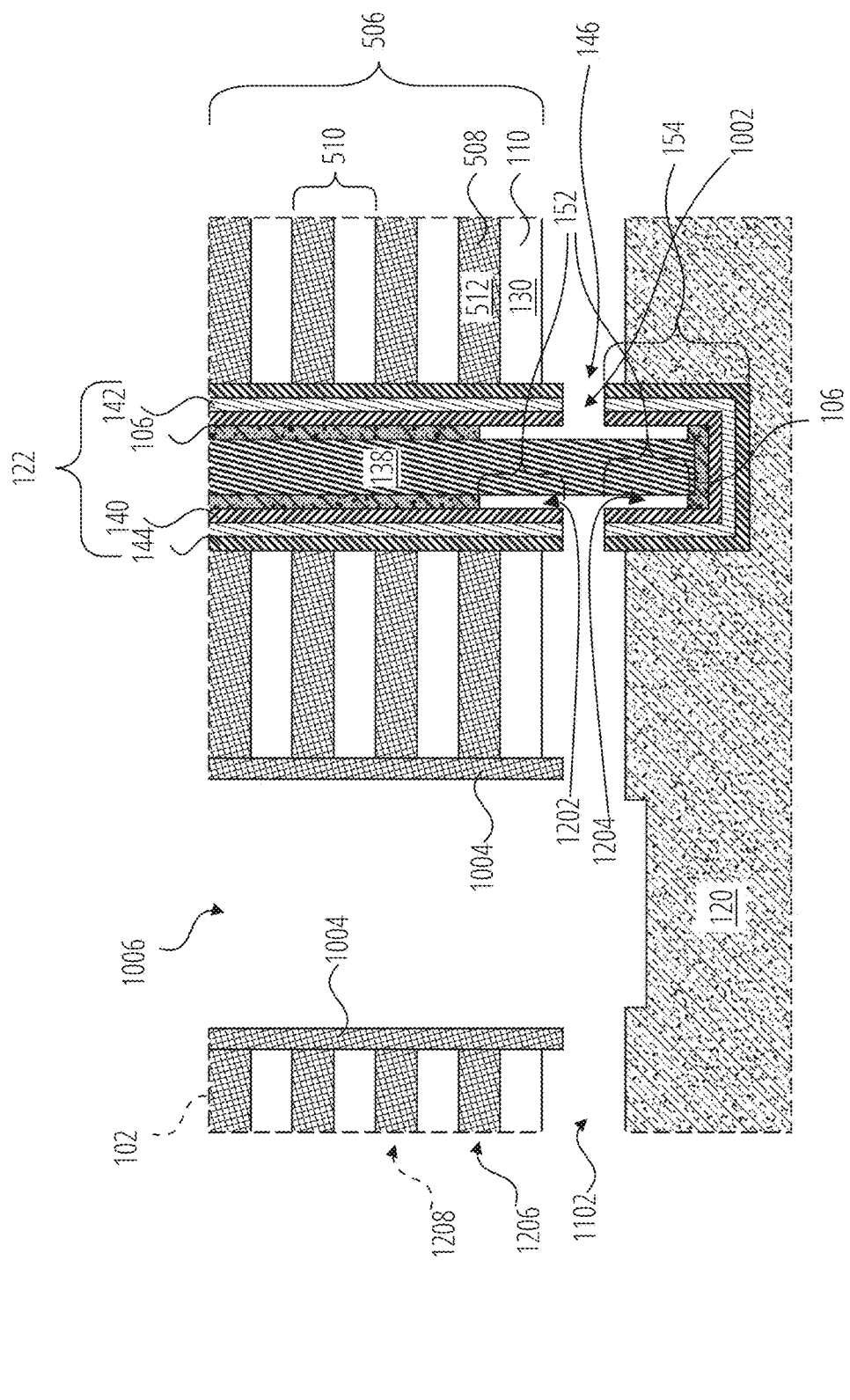

While or after removing the first sacrificial material 502 (FIG. 10), the portion of the channel material 106 exposed in the lateral expansion 1002 is removed—as illustrated in FIG. 12—both laterally and vertically, in some portion, to form an upper vertical recess 1202 of vertical recess height 152 and to form a lower vertical recess 1204 of substantially the same vertical recess heights 152.

In some embodiments, the channel material 106 may be recessed by, e.g., a wet etching process and/or a dry etching process targeted to etching semiconductor material (e.g., polysilicon) so that portions of the channel material 106 above and below the lateral expansion 1002 is removed without substantially removing the insulative material 138 at the core of the pillar 122, the cell materials (e.g., the dielectric blocking material 144, the memory material 142, and the tunnel dielectric material 140) of the pillar 122, the thinner sacrificial liner 1004 in the broader slit 1006, and the insulative material 130 of the insulative structure 110 exposed in the source region void 1102. Etching the channel material 106 may also remove some of the base structure 120, though at least a U-shaped portion of the cell materials may remain, below the lateral expansion 1002, at least partially in the base structure 120.

As discussed above, the pillar openings in which the materials of the pillar 122 were formed may have been etched to a depth in the base structure 120 to provide the depth 154 of the cell materials (e.g., the dielectric blocking material 144, the memory material 142, and the tunnel dielectric material 140) remaining in the U-shaped structure under the lateral opening 146 (formed by the lateral expansion 1002) after recessing the channel material 106. The depth 154 may be such as to ensure that not all of the channel material 106 is removed from below the insulative material 138 at the core of the pillar 122. Accordingly, in some embodiments, the depth 154 may be about three times (3×) to about four times (4×) the vertical recess height 152 so that a portion of the channel material 106 remains under, and supporting, the insulative material 138 at the core of the pillar 122. The remaining materials of the U-shaped structure may, therefore, provide structural support to maintain the physical integrity of the pillar 122 after the formation of the lateral expansion 1002 (e.g., the lateral opening 146), the upper vertical recess 1202, and the lower vertical recess 1204.

The channel material 106 is recessed a height (e.g., the vertical recess height 152) tailored so that the upper vertical recess 1202 extends at least proximate if not also overlapping at least one of the lower sacrificial structures 508 that will eventually become a source-side GIDL region. For example, the channel material 106 may be recessed so that the upper vertical recess 1202 extends to at least within about (e.g., at least within about 5 nm) of a level for GIDL region 1206 (to eventually become the GIDL region 134 of FIG. 1) to about even with an upper surface of a level for additional GIDL region 1208 (in embodiments to include the additional GIDL region 136 of FIG. 1). That is, the upper elevation of the upper vertical recess 1202 may be at an elevation within about 10 nm below (e.g., within about 5 nm below) a lower surface of the lowest sacrificial structure 508 of the stack structure 506 and about equal to an upper surface of the sacrificial structure 508 intended to become the highest source-side GIDL region (e.g., the additional GIDL region 136 of FIG. 1).

Figure 13:
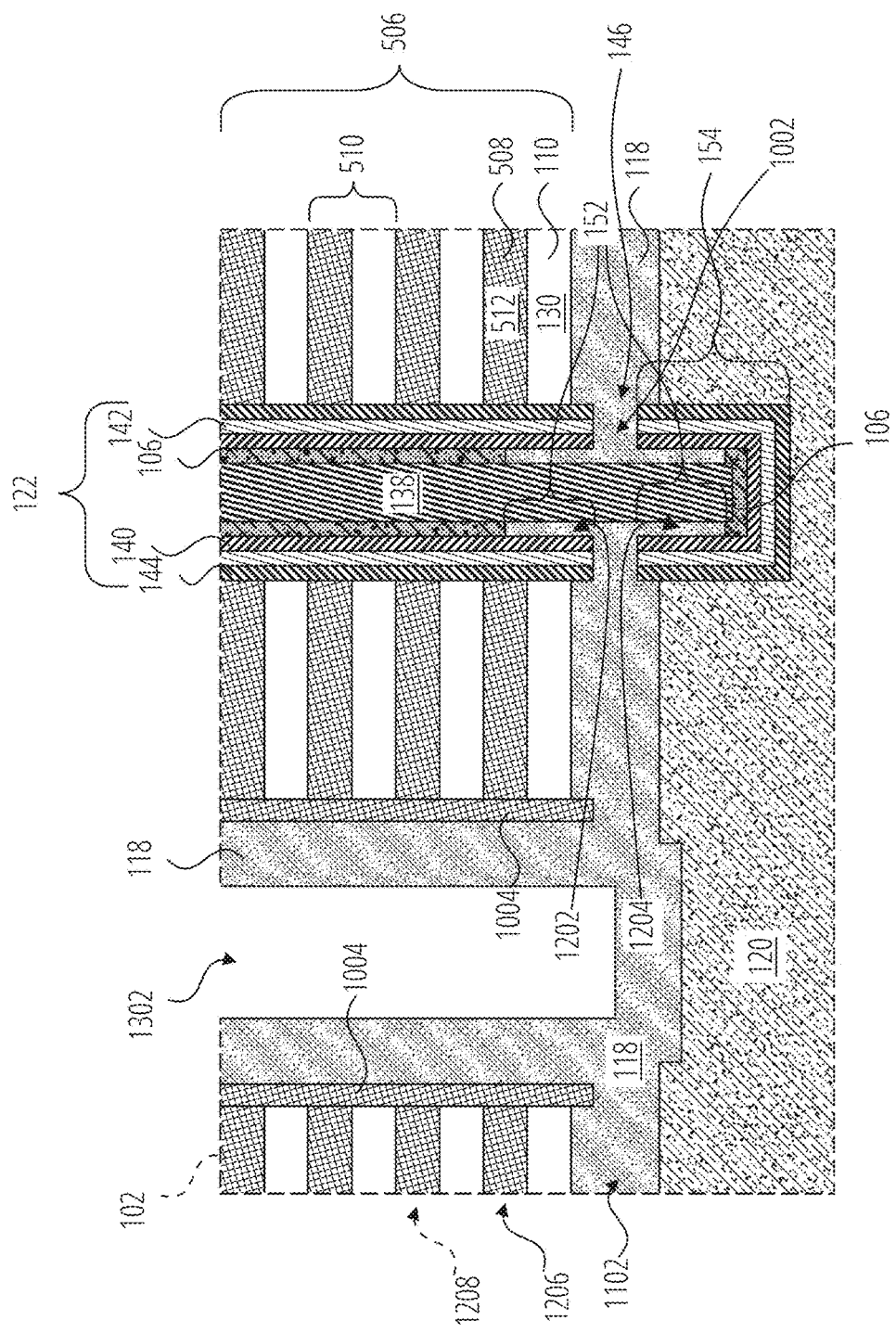

With reference to FIG. 13, the doped material 118 of the source region 124 (FIG. 1) is formed (e.g., deposited), filling or substantially filling the upper vertical recess 1202, the lower vertical recess 1204, and the source region void 1102. The doped material 118 may also be formed on the thinner sacrificial liner 1004, forming a lined slit 1302. In other embodiments, the doped material 118 may be formed to substantially fill the volume within the thinner sacrificial liner 1004.

Forming the doped material 118 in the upper vertical recess 1202 disposes the doped material 118—and its relatively high dopant concentration (e.g., with respect to a relatively lower dopant concentration in the channel material 106)—in close proximity to the elevations of the stack structure 506 that will become the source-side GIDL region(s) (e.g., in close proximity to at least the level for GIDL region 1206 and, in some embodiments, also in close proximity to the level for additional GIDL region 1208, depending on the vertical recess height 152). This close proximity of dopant to GIDL region elevation(s) may be accomplished without necessitating, e.g., a thermally-driven out-diffusion of dopant from the doped material 118. In other embodiments, a thermally-driven out-diffusion of dopant may also be performed. In some such embodiments, the temperatures may be relatively lower than and/or the duration of the temperature exposure may be relatively shorter than may otherwise be utilized if relying upon thermally-driven out-diffusion alone for ensuring a sufficient dopant concentration in the level(s) of the GIDL regions (e.g., the level for GIDL region 1206 and, in some embodiments, the level for additional GIDL region 1208).

Forming the doped material 118 in the spaces formed by vertically recessing the channel material 106 also facilitates disposing the doped material 118 at a targeted elevation (e.g., an elevation, in the stack structure 506, of the interface between the doped material 118 and the channel material 106) proximate the GIDL region(s) without necessitating a so-called "punch" through (e.g., vertical etch) of materials at the base of a high-aspect-ratio opening. That is, the disclosed methods may, at least in some embodiments, avoid a stage of vertically etching materials (e.g., the channel material 106, the cell materials) at the base of the pillar opening prior to forming the doped material 118 in the areas within the horizontal footprint of the pillar 122. Avoiding a vertical etching at the base of a high-aspect-ratio opening may simplify the fabrication process and avoid potential process failures, particularly as the number of tiers 510 of the stack structure 506 are scaled up to greater numbers. For example, without utilizing a vertical etching of the channel material 106 and the cell materials at the base of the pillar opening during the fabrication process, the width of the pillar opening (e.g., at the base of the pillar 122) may not need to be formed as broadly as it may otherwise need to be formed to enable a vertical punch. With less fabrication criticality resting upon the pillar base width, the pillar 122 itself may be more narrowly formed than it may otherwise have been formed, which may also enable scaling of the pillar 122 array to include a greater density of pillars 122 per unit of microelectronic device structure cross-sectional footprint area.

Figure 14:
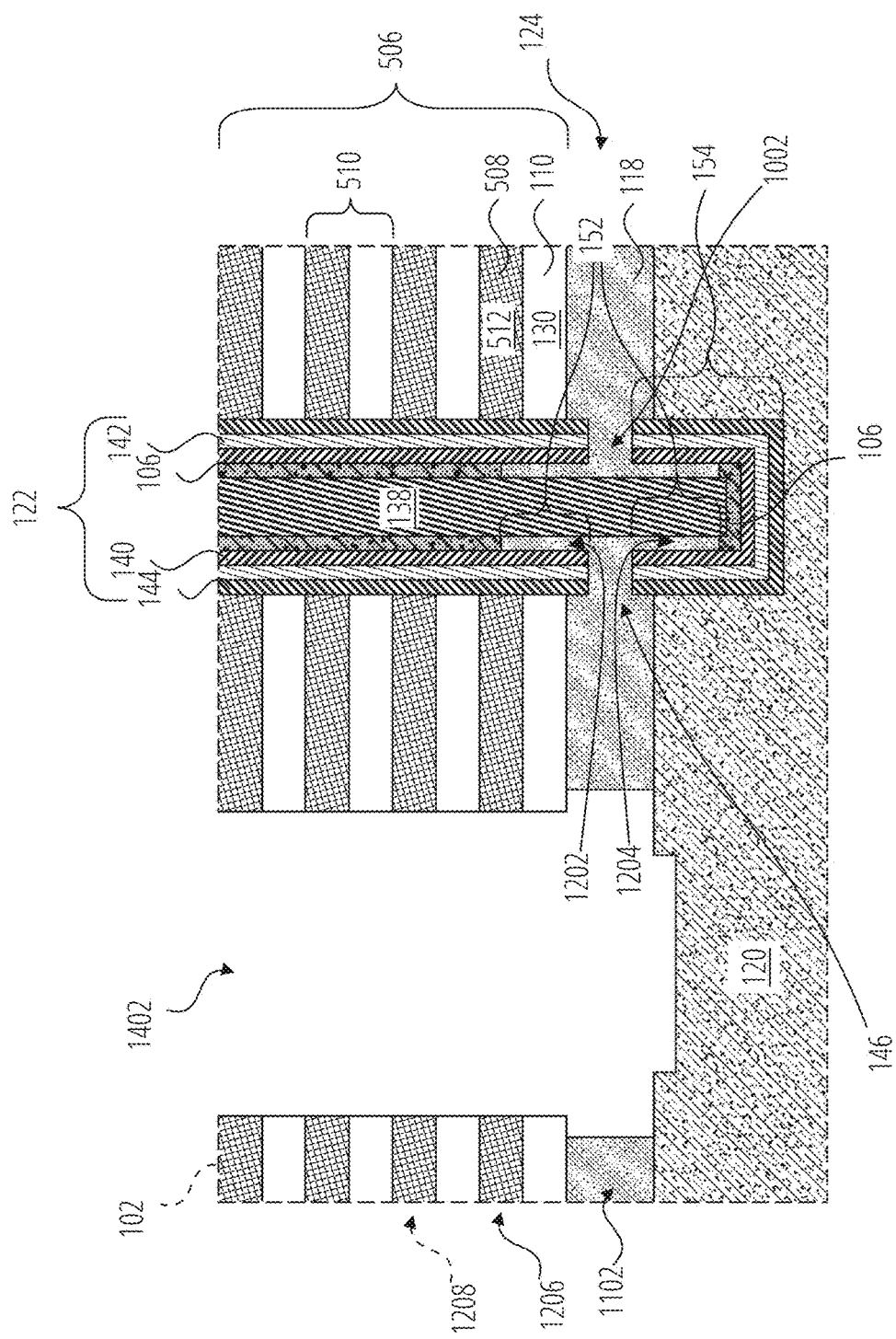

After forming the doped material 118 in the source region void and to laterally and vertically extend into the base of the pillar 122, the doped material 118 and the thinner sacrificial liner 1004 may be selectively removed, as illustrated in FIG. 14, from the sidewalls along the tiers 510 of the stack structure 506. The doped material 118 and the thinner sacrificial liner 1004 may be removed without substantially removing the materials of the tiers 510 (e.g., the sacrificial material 512 of the sacrificial structures 508 and the insulative material 130 of the insulative structures 110). For example, the doped material 118 and the thinner sacrificial liner 1004 may be isotropically etched, such as by an etchant comprising tetramethylammonium hydroxide (TMAH). In a resulting slit 1402, ends of the sacrificial structures 508 and the insulative structures 110 of the stack structure 506 are exposed. A portion of the doped material 118 exposed in the slit 1402 in the elevations of the source region 124 (e.g., from the source region void 1102) may also be removed, laterally recessing the doped material 118 relative to sidewalls of the stack structure 506 defining the slit 1402.

Figure 15:
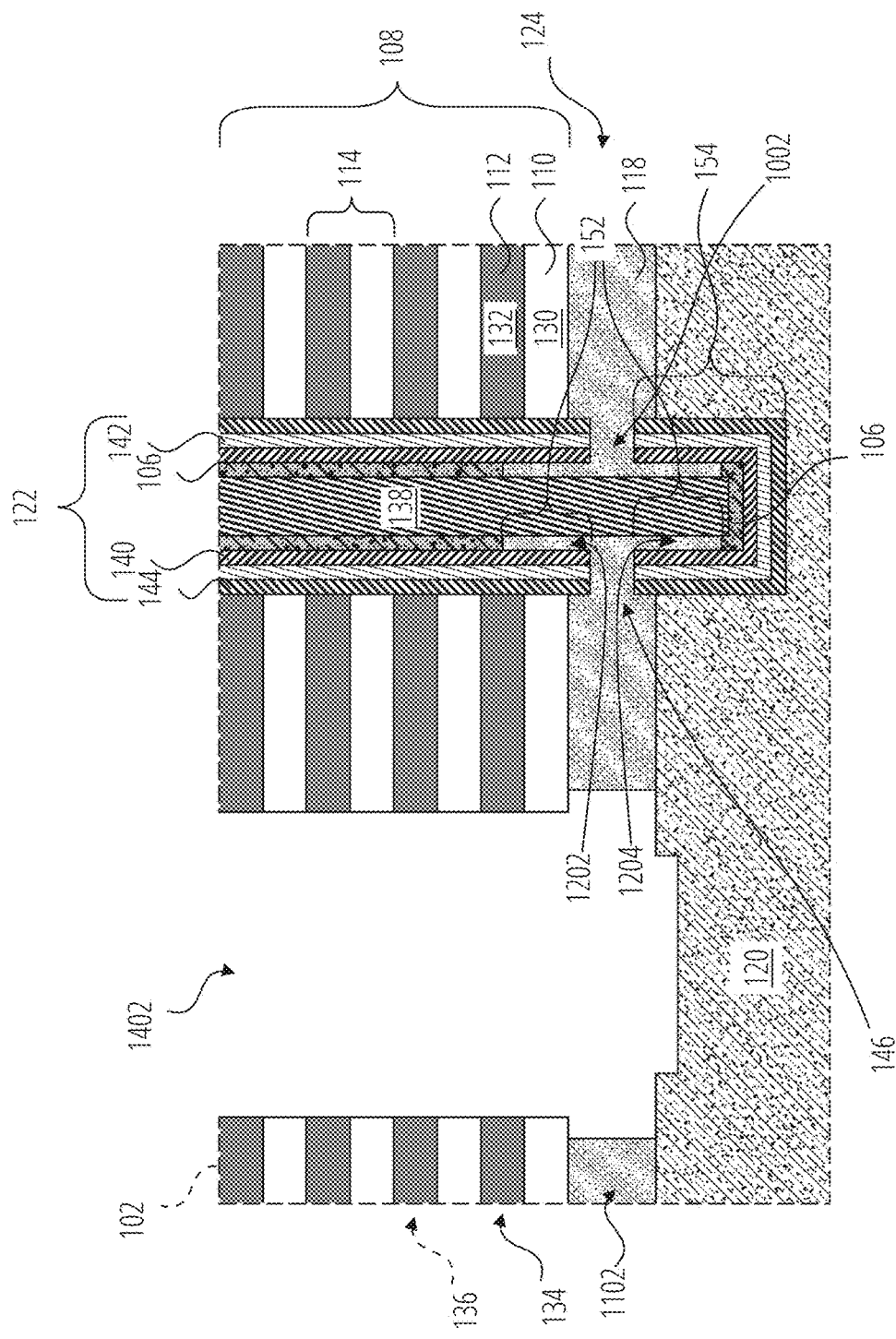

A "replacement gate" process may be performed, via the slit 1402, to exhume the sacrificial material 512—and therefore the sacrificial structures 508—and to form, as illustrated in FIG. 15, the conductive material(s) 132 (e.g., the conductive material 404 of FIG. 4A and/or the conductive liner material 408 and the conductive metal 406 of FIG. 4B) in place of the sacrificial structures 508 (FIG. 14). The replacement gate process forms the conductive structures 112 of the tiers 114 of the stack structure 108.

In the slit 1402, the insulative liner 126 (FIG. 1) may be formed (e.g., deposited) on sidewalls of the tiers 114 of the stack structure 108. The nonconductive fill material 128 (FIG. 1) may be formed (e.g., deposited) to fill or substantially fill a remaining volume between the insulative liner 126 to complete the slit structure 116 (FIG. 1) (e.g., for each of the slit structures 116 of the microelectronic device structure 200 of FIG. 2 and FIG. 3).

In some embodiments, the stages of FIG. 5 through FIG. 15 and then FIG. 1 may be performed for the lower deck 202 of the microelectronic device structure 200 (FIG. 2) before forming the upper deck 204 of the microelectronic device structure 200. For example, after completing the formation of the microelectronic device structure 100 of FIG. 1 to form the lower deck 202 (FIG. 2), as described above, additional tiers 510 (FIG. 5) of sacrificial structures 508 vertically interleaved with insulative structures 110 are formed on the lower deck 202; the portions of the pillars 122 of the upper deck 204 are formed through the additional tiers 510; an upper slit (e.g., like the slit 1402 through the stack structure 506 of FIG. 14) is formed through the additional tiers 510; the replacement gate process is performed to replace the sacrificial structures 508 with conductive structures 112 of the upper deck 204; and the materials of the slit structure 116 are formed in the slit of the upper deck 204 to form the microelectronic device structure 200 of FIG. 2 and FIG. 3, including the microelectronic device structure 100 of FIG. 1 in the lower deck 202.

In some embodiments, the tiers 510 and pillars 122 of the lower deck 202 (FIG. 2) and the upper deck 204 are formed in separate stages prior to conducting the replacement gate process. For example, before the stage of FIG. 14, the stages of FIG. 5 through FIG. 13 are performed to fabricate the lower deck 202 of the microelectronic device structures 200 (FIG. 2). Then, the upper deck 204 of the microelectronic device structure 200 is formed with a continuation of the stack structure 506 (FIG. 13) that includes the sacrificial structures 508. Then, with the stack structure 506 including tiers 510 for both the lower deck 202 and the upper deck 204 formed, the slits 1402 (FIG. 14) may be formed through both the upper deck 204 and the lower deck 202, the replacement gate process performed (FIG. 15) to replace the sacrificial structures 508 with conductive structures 112 in both the upper deck 204 and the lower deck 202 of the stack structure 108, and the slit structure 116 fabrication completed (e.g., FIG. 1) to form the microelectronic device structure 200 (FIG. 2, FIG. 3) that includes the microelectronic device structure 100 of FIG. 1 in the lower deck 202.

In other embodiments, as discussed above, the stages of FIG. 5 through FIG. 15 and then FIG. 1 may be performed for both the lower deck 202 (FIG. 2) and the upper deck 204 (FIG. 2) together, such that the stack structure 506 of FIG. 5 through FIG. 14 and then the stack structure 108 of FIG. 15 and FIG. 1 represent the stack structure 506 of tiers 510 (in FIG. 5 through FIG. 14) and the stack structure 108 of tiers 114 (in FIG. 15 and FIG. 1), respectively, forming both the lower deck 202 and the upper deck 204.

Accordingly, disclosed is a method of forming a microelectronic device. The method includes forming, on a base structure, a stack of sacrificial materials. A tiered stacked structure is formed on the stack of sacrificial materials. The tiered stack structure comprises a vertically alternating sequence of insulative structures and other structures arranged in tiers. A pillar opening is formed through the tiered stack structure, through the stack of sacrificial materials, and into the base structure. Cell materials, a channel material, and an insulative core material are formed in the pillar opening. A slit is formed through the tiered stack structure and at least partially through the stack of sacrificial materials. At least one of the sacrificial materials, of the stack of sacrificial materials, is selectively removed to expose at least one cell material formed in the pillar opening. A lateral opening is formed through the cell materials to expose a portion of the channel material in the lateral opening. The channel material is recessed to form a vertical recess protruding to an elevation within the stack structure. A doped material is formed in the vertical recess.

The stages of FIG. 5 through FIG. 15 and FIG. 1 illustrate a method in which the replacement gate process is conducted after completing the formation of the source region 124 and the pillars 122 with the vertical recesses of the channel material 106 and with the vertical extensions of the doped material 118 of the source region 124. In other embodiments, such as that illustrated by the various stages of FIG. 16 through FIG. 27, the replacement gate process is conducted before vertically recessing the channel material 106 and forming the vertical extensions of the doped material 118.

Figure 16:
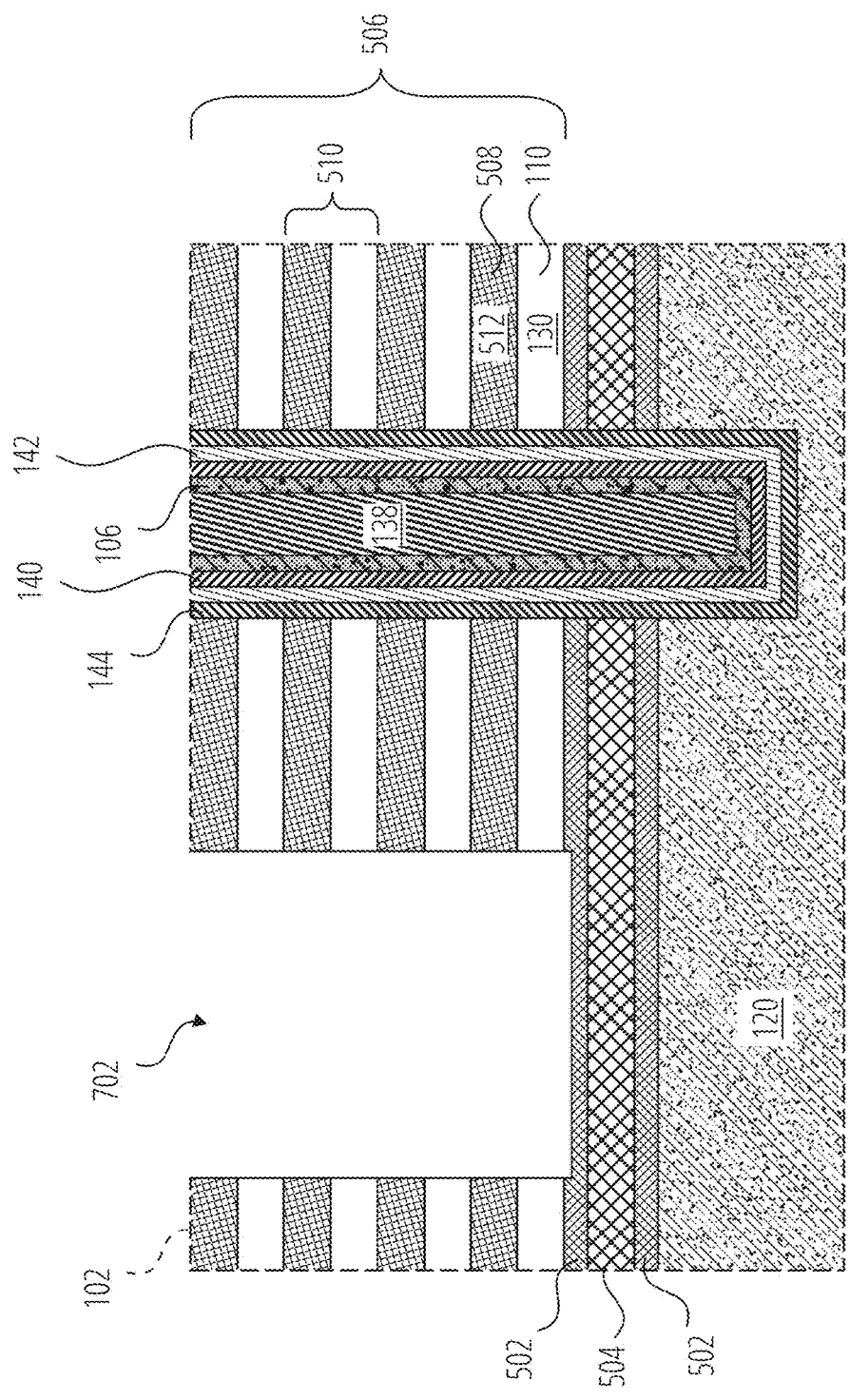
FIG. 16 through FIG. 26, in conjunction with FIG. 5 and FIG. 6, are cross-sectional, elevational, schematic illustrations of various stages of processing to fabricate a microelectronic device structure, illustrated in FIG. 26, FIG. 27, and FIG. 3, in accordance with embodiments of the disclosure, wherein the stage of FIG. 16 follows that of FIG. 6.

With reference to FIG. 16, the illustrated stage may follow that illustrated in FIG. 5 (forming the sacrificial sandwich structure of the first sacrificial material 502 and the second sacrificial material 504 and forming the stack structure 506 with the sacrificial structures 508) and FIG. 6 (forming the insulative material 138, the channel material 106, and the cell materials in pillar openings). The slit 702 is formed (e.g., for each slit structure 116 (FIG. 3) to be fabricated) through the stack structure 506 in substantially the same manner described above with regard to FIG. 7. However, in some embodiments, the slit 702 is formed to a depth that does not extend wholly through the upper region of the first sacrificial material 502. Therefore, the slit 702 exposes sidewalls of the sacrificial structures 508 and the insulative structures 110 of the tiers 510 of the stack structure 108 and exposes a portion of the first sacrificial material 502.

Figure 17:
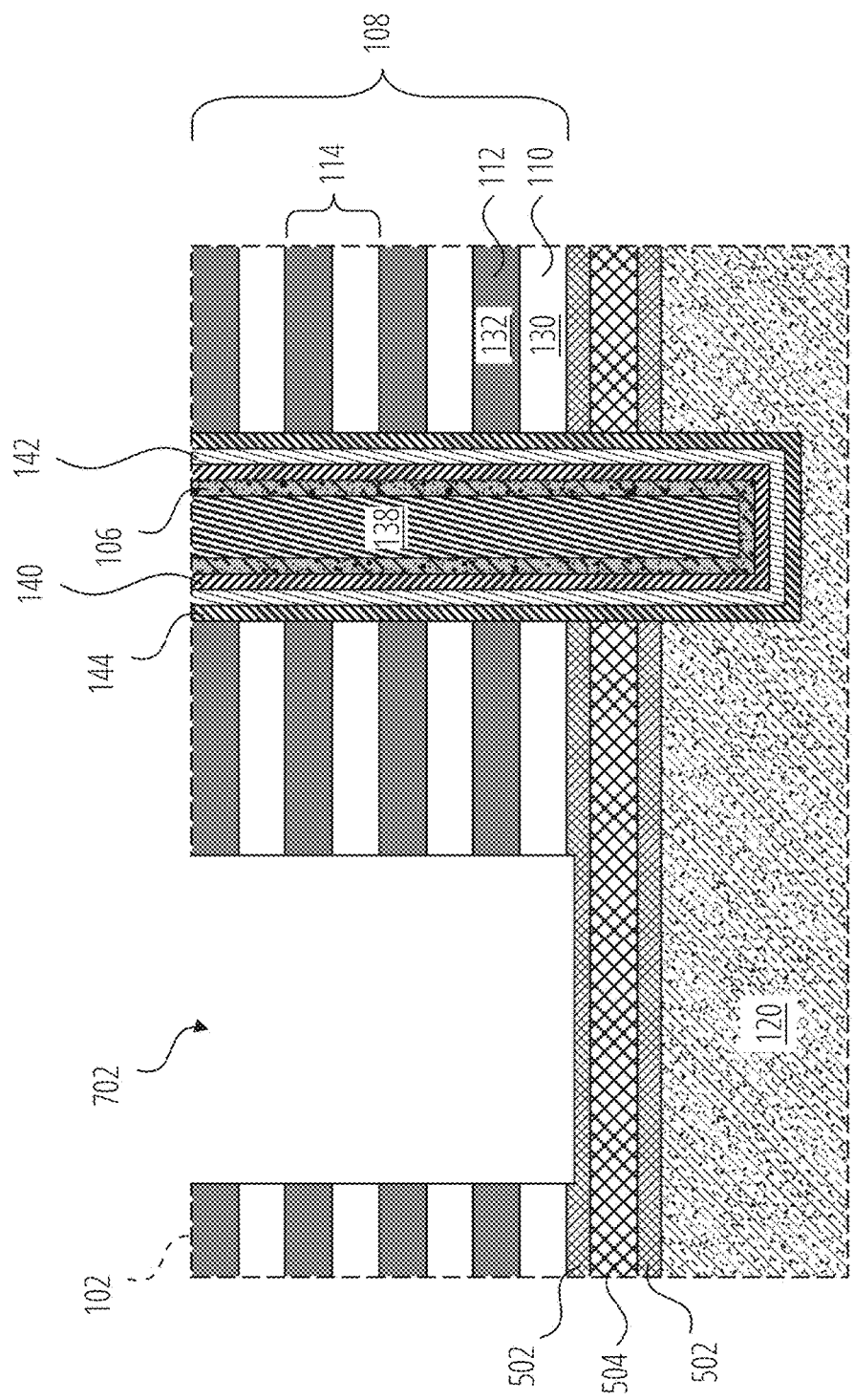

The replacement gate process is performed, via the slit 702, to form—in place of the sacrificial structures 508—the conductive structures 112 of the tiers 114 of the stack structure 108, as illustrated in FIG. 17. This replacement gate process may be substantially similar to that described above with respect to FIG. 15.

Figure 18:
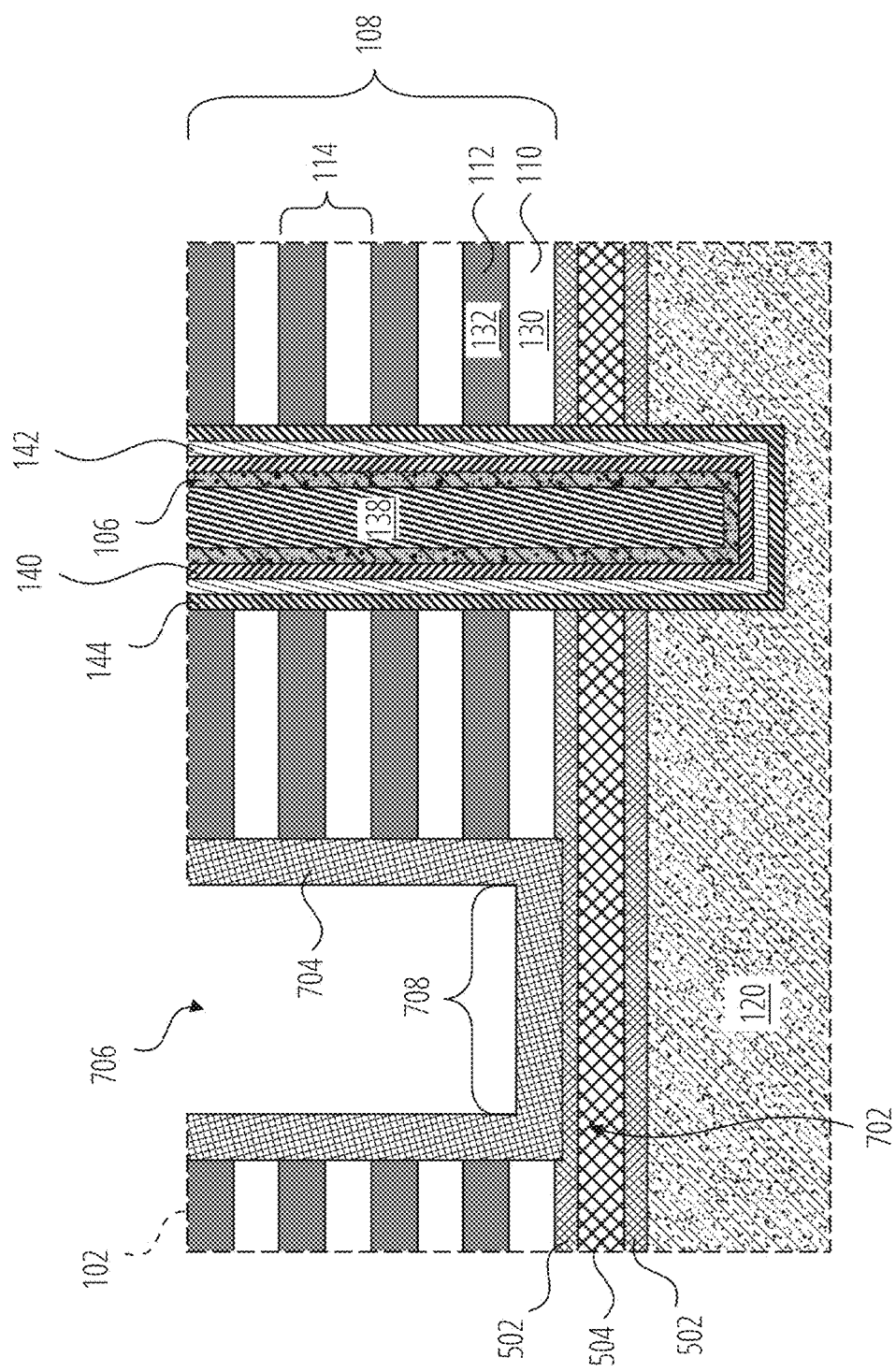

With reference to FIG. 18, the sacrificial liner 704 may be formed (e.g., in a manner substantially similar to that described above with respect to FIG. 7) in the slit 702, forming the lined slit 706. However, in this embodiment, the sacrificial liner 704 is disposed on sidewalls of the conductive structures 112 and the insulative structures 110 of the tiers 114 of the stack structure 108. The sacrificial liner 704 may also be formed on a portion of the first sacrificial material 502. The base portion 708 is then removed (e.g., etched), in a manner similar to that described above with respect to FIG. 8.

Figure 19:
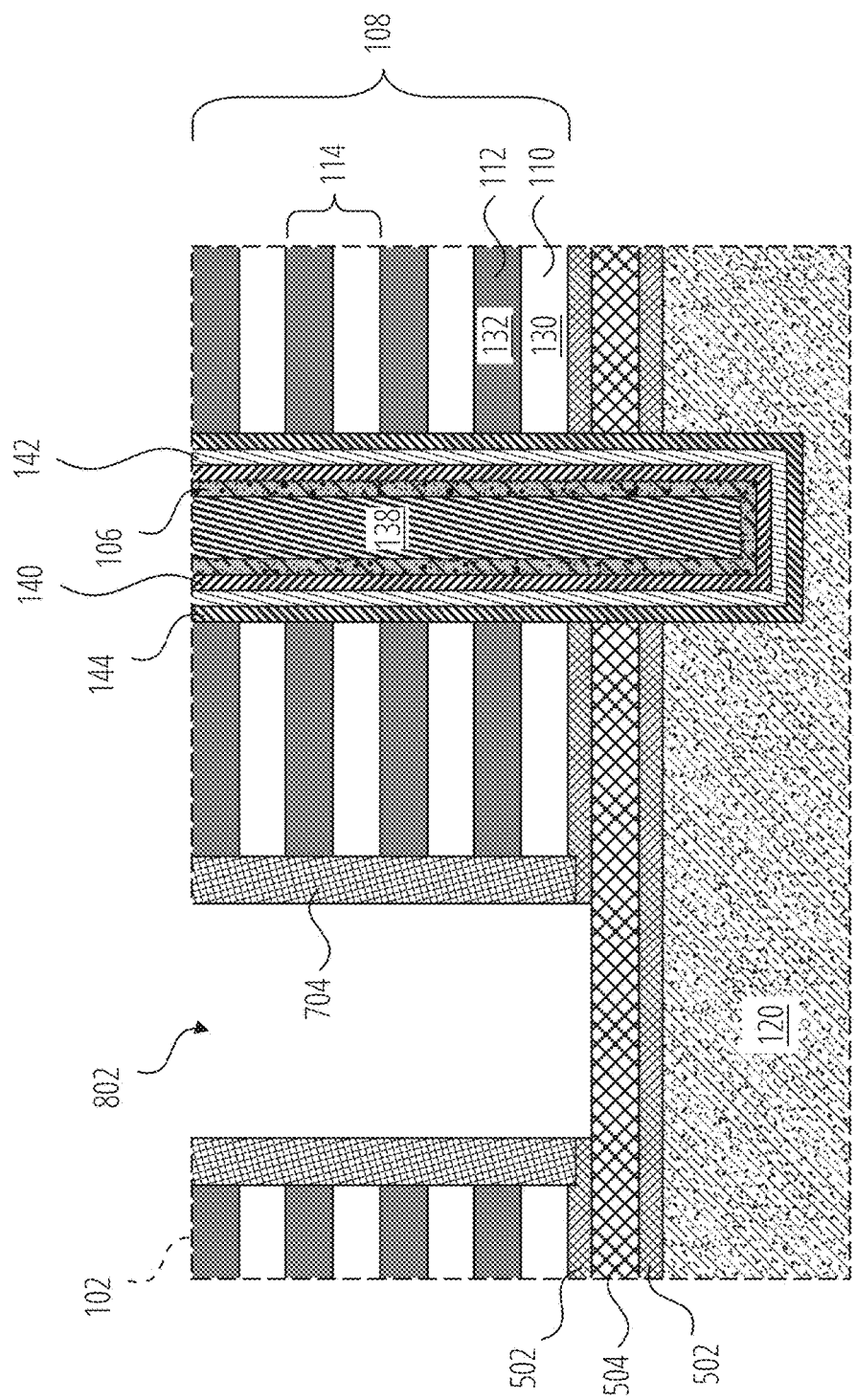

With reference to FIG. 19, after or while removing the base portion 708 (FIG. 18) of the sacrificial liner 704, a portion of the upper region of the first sacrificial material 502 is also removed (e.g., in a manner similar to the etching of the upper region of the first sacrificial material 502 described above with regard to FIG. 8). In some embodiments, none or only some of the second sacrificial material 504 may be removed, such that the extended slit 802—formed by removing the base portion 708 of the sacrificial liner 704 and the exposed portion of the upper region of the first sacrificial material 502—exposes an upper surface of the second sacrificial material 504 without exposing any portion of the lower region of the first sacrificial material 502. (As discussed above, this same approach may be taken with regard to forming the extended slit 802 of FIG. 8, rather than etching through the second sacrificial material 504 and into or through the first sacrificial material 502.) Alternatively, in a substantially similar manner to that illustrated in FIG. 8, the extended slit 802 may be formed to extend wholly through the second sacrificial material 504 and into or through the lower region of the first sacrificial material 502 and, in some embodiments, partially into the base structure 120.

Figure 20:
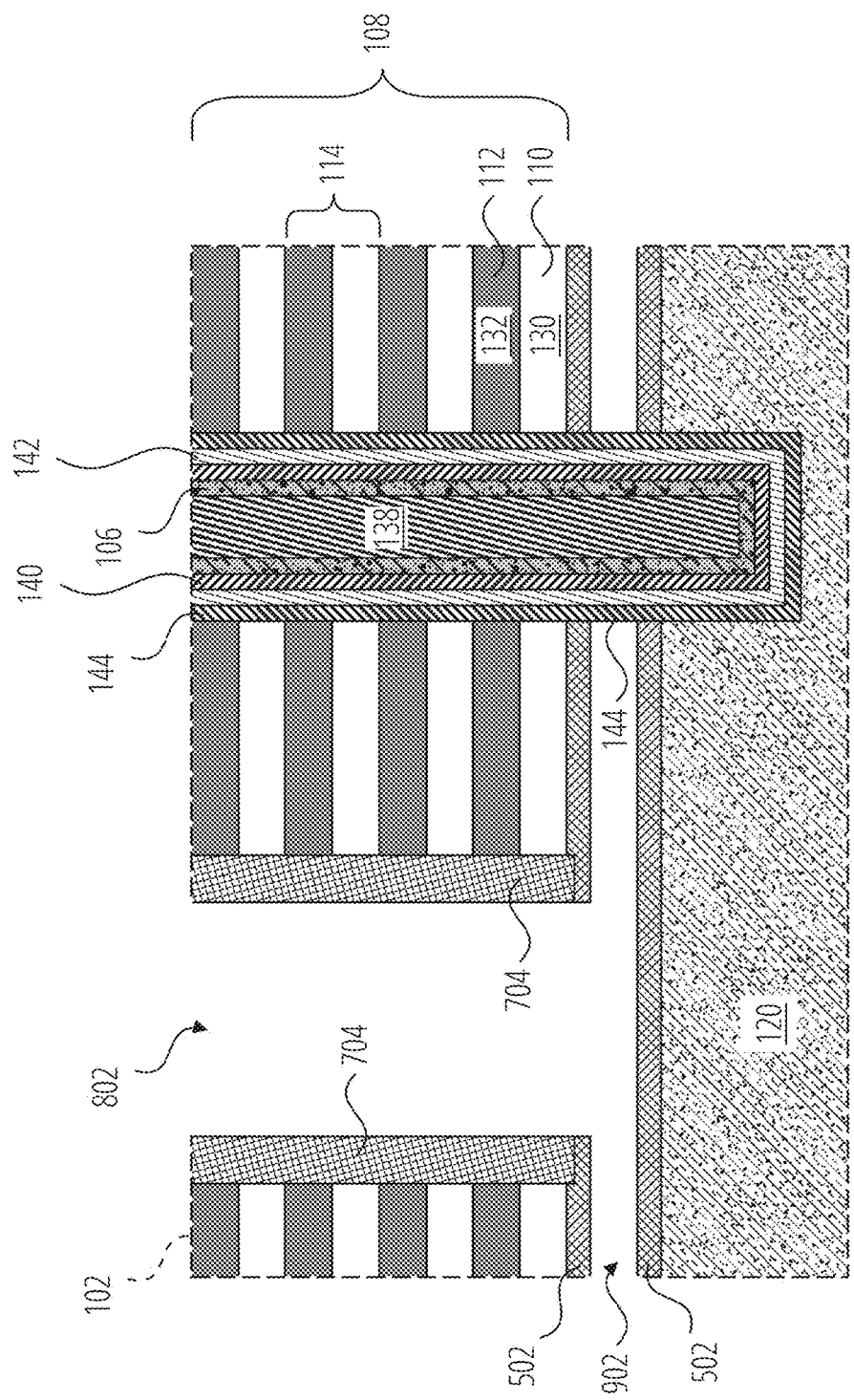

The second sacrificial material 504 is removed, as illustrated in FIG. 20, to form the void 902 in a manner substantially similar to that described above with regard to FIG. 9. In embodiments in which the extended slit 802 was formed to not extend through the lower region of the first sacrificial material 502, none of the base structure 120 may be exposed in the void 902.

Figure 21:
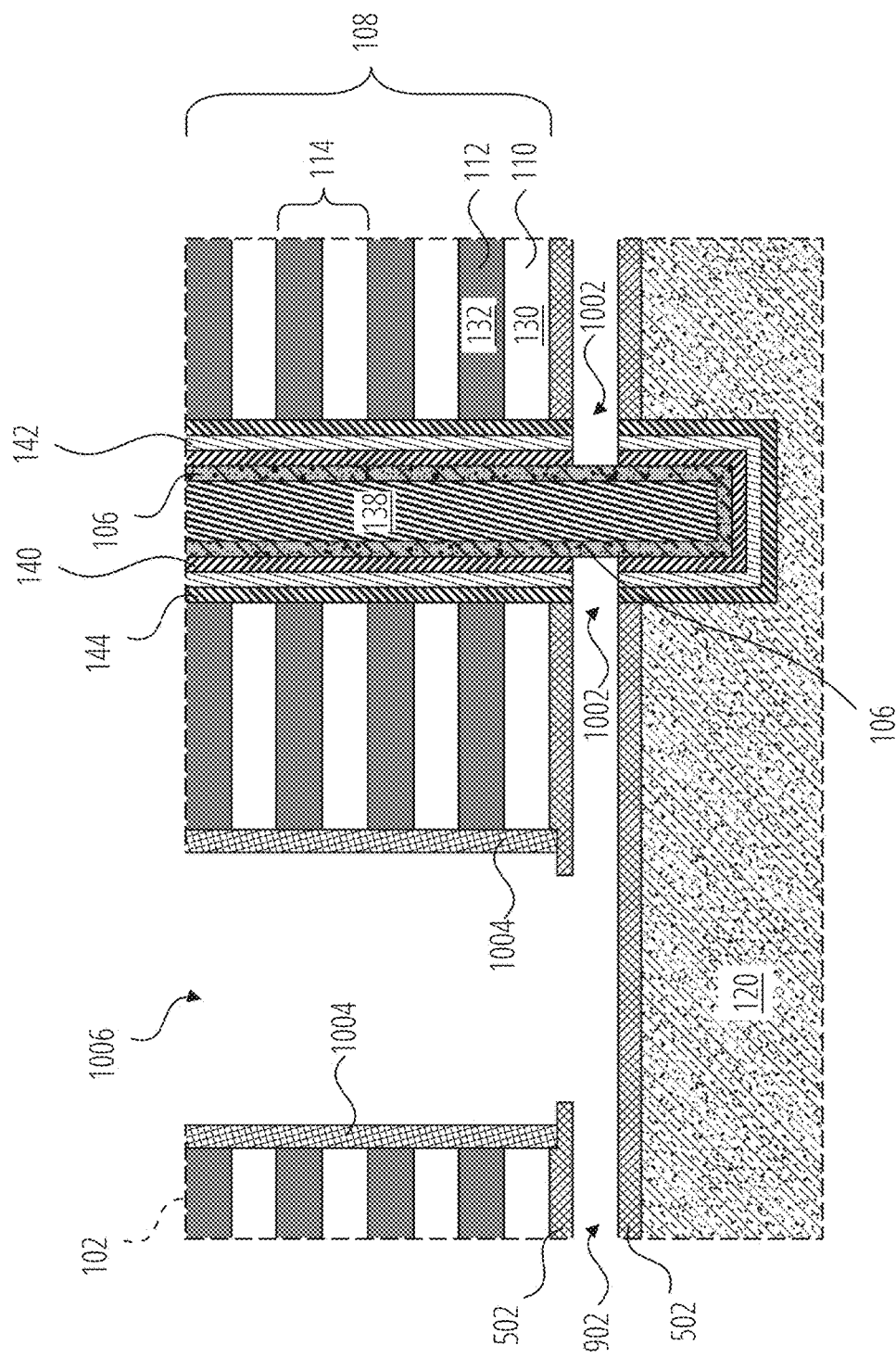

With reference to FIG. 21, the lateral expansion 1002 is then formed (e.g., in a manner substantially similar to that described above with respect to FIG. 10) to expose the channel material 106 in the vicinity between the stack structure 108 and the U-shaped structure of cell materials under the lateral expansion 1002. Laterally etching the cell materials to form the lateral expansion 1002 may also thin the sacrificial liner 704 (FIG. 20) to form the thinner sacrificial liner 1004 along sidewalls defining the broader slit 1006. In embodiments in which the lower region of the first sacrificial material 502 has not yet been etched through, still no portion of the base structure 120 may be exposed at this stage.

Figure 22:
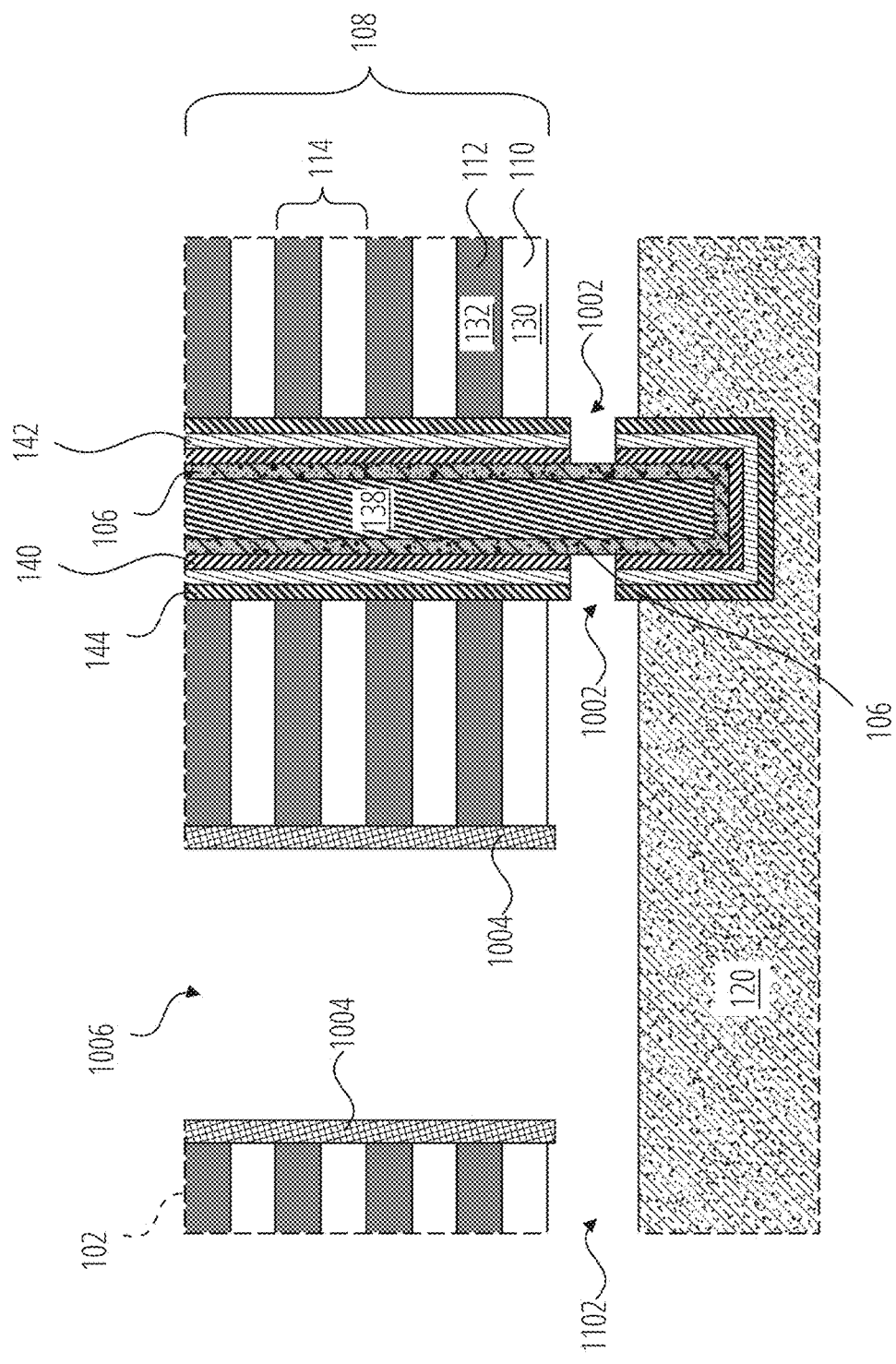

After laterally etching the cell materials to form the lateral expansion 1002, the first sacrificial material 502 is selectively removed (e.g., exhumed), as illustrated in FIG. 22, in a manner substantially similar to that described above with respect to FIG. 11, to form the source region void 1102.

Figure 23:
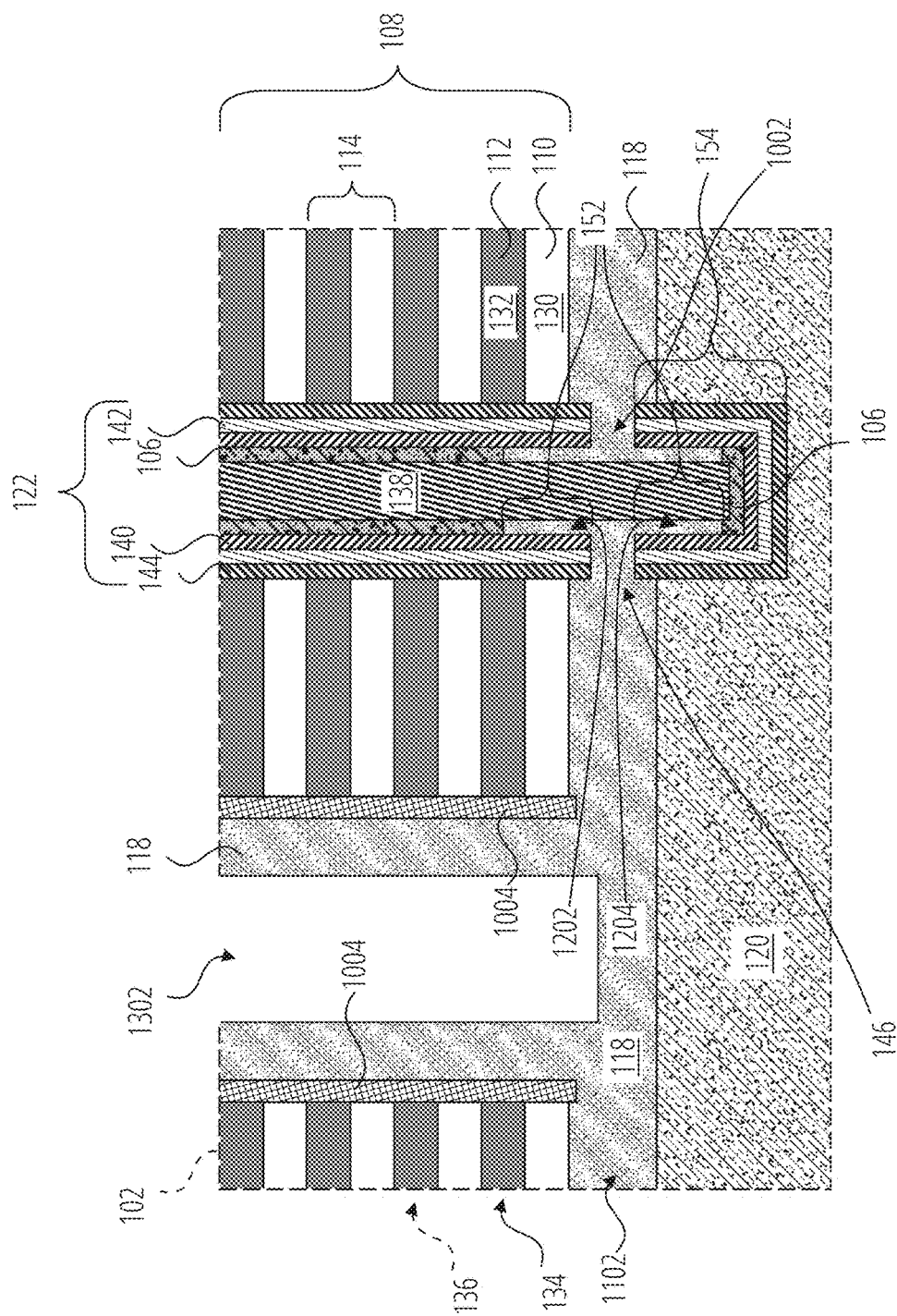

With reference to FIG. 23, the channel material 106 is vertically recessed (forming the upper vertical recess 1202 and the lower vertical recess 1204), and the doped material 118 is formed in the recesses in a manner substantially similar to that described above with respect to FIG. 12 and FIG. 13. However, because the replacement gate process has already been performed, the formation of the doped material 118 in the upper vertical recess 1202 disposes the dopant of the doped material 118 proximate the conductive structure 112 of the GIDL region 134 (or of the GIDL region(s), including the, optional, additional GIDL regions 136) without, in some regions, necessitating an out-diffusion of dopant from the doped material 118 to the targeted elevation.

Figure 24:
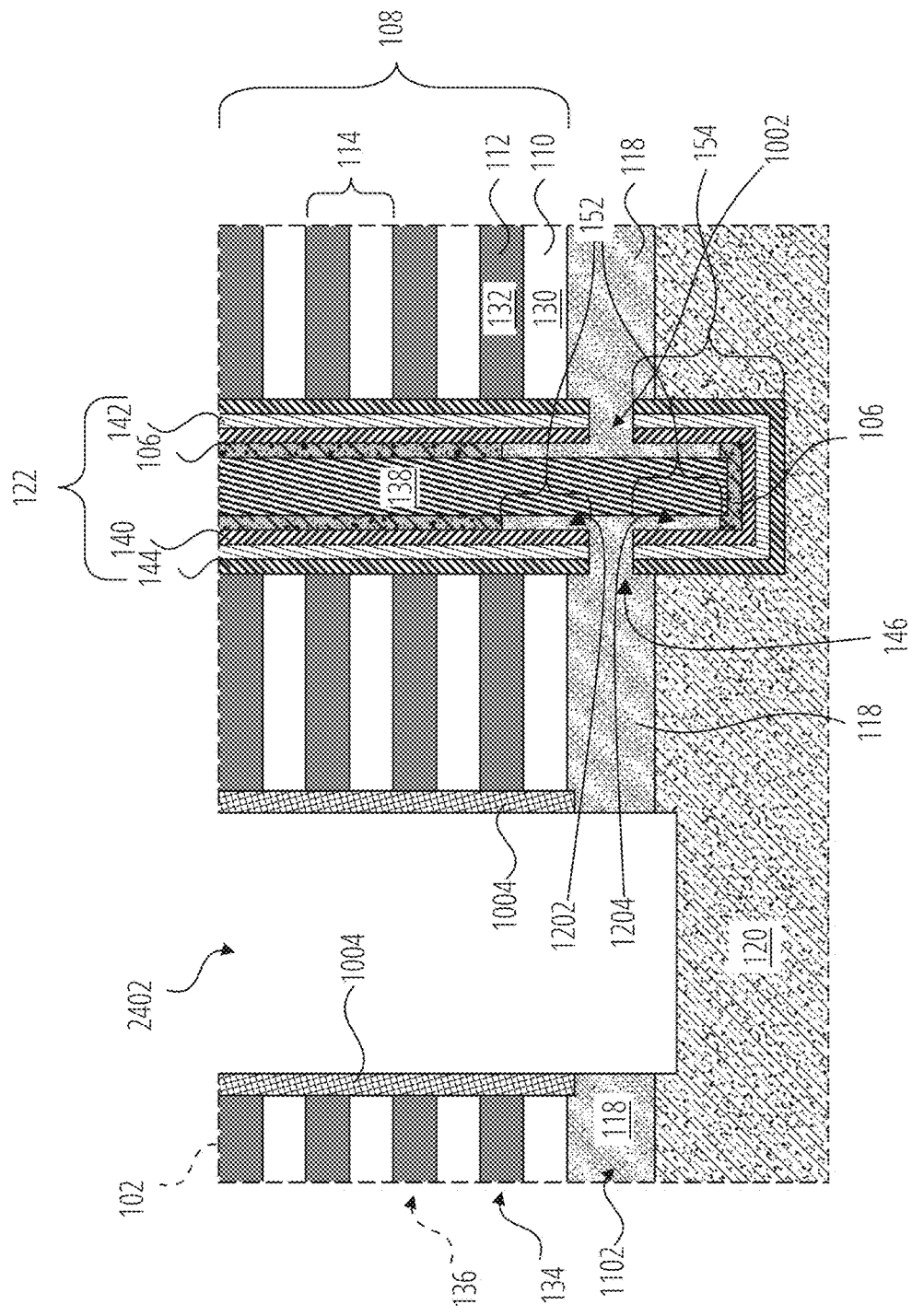

With reference to FIG. 24, a broader slit 2402 may be formed (e.g., for each slit structure 116 (FIG. 3) to be formed), for example, by isotropically etching the doped material 118 and using the thinner sacrificial liner 1004 as a protective sidewall for the tiers 114 of the stack structure 108. The broader slit 2402 extends vertically through the doped material 118, exposing a portion of the base structure 120 at the base of each of the broader slits 2402.

Figure 25:
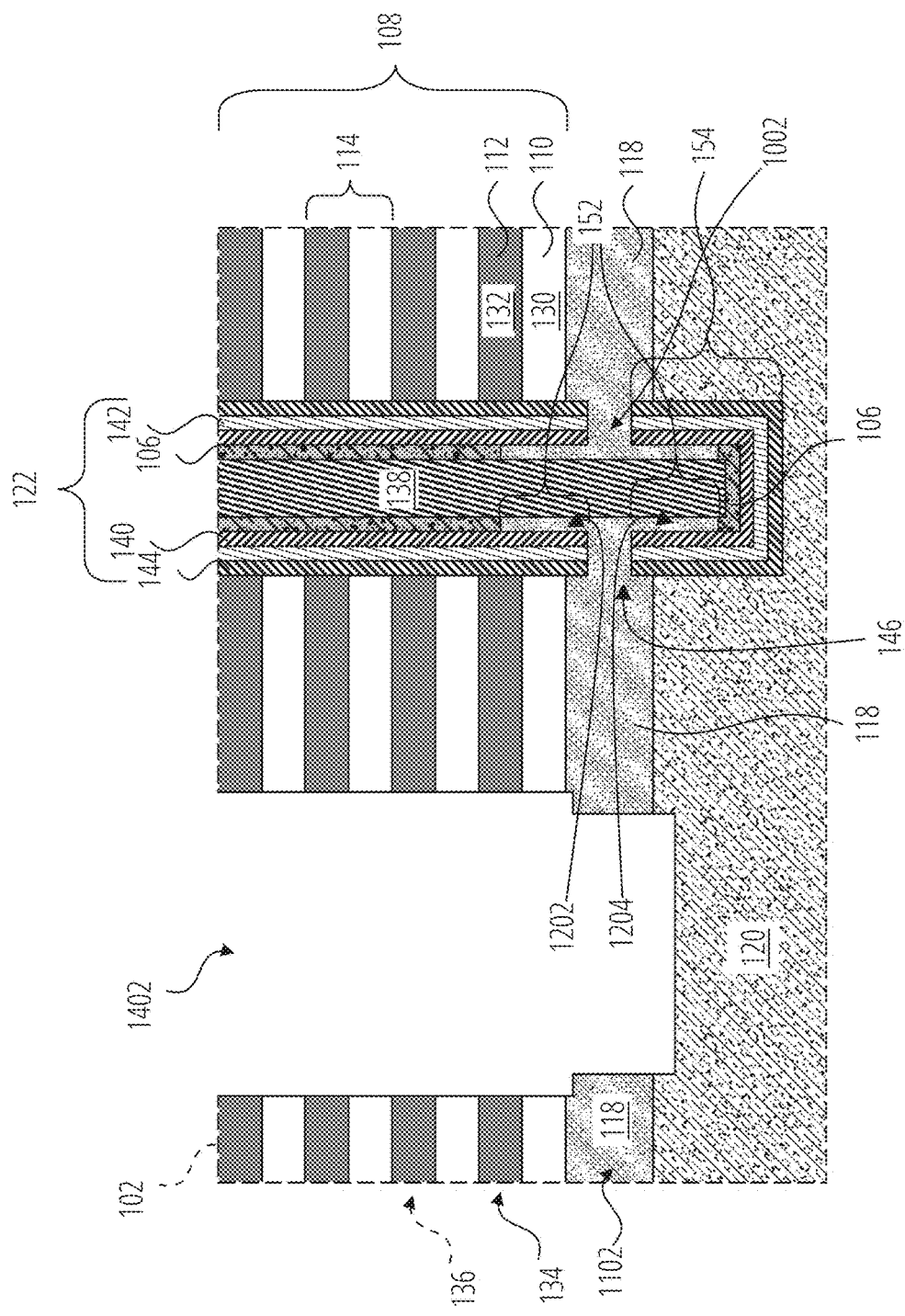

The remaining portions of the thinner sacrificial liner 1004 may be removed (e.g., selectively etched), as illustrated in FIG. 25, to form the slits 1402 that extend through the stack structure 108, through the doped material 118, and to or partially into the base structure 120. For example, in embodiments in which the thinner sacrificial liner 1004 (e.g., formed from the sacrificial liner 704) was formed of and included a nitride material, a material-removal process selective to nitride material may be used to remove the thinner sacrificial liner 1004 without removing the insulative material 130 of the insulative structures 110 and without removing the conductive material(s) 132 of the conductive structures 112 in the stack structure 108.

Figure 26:
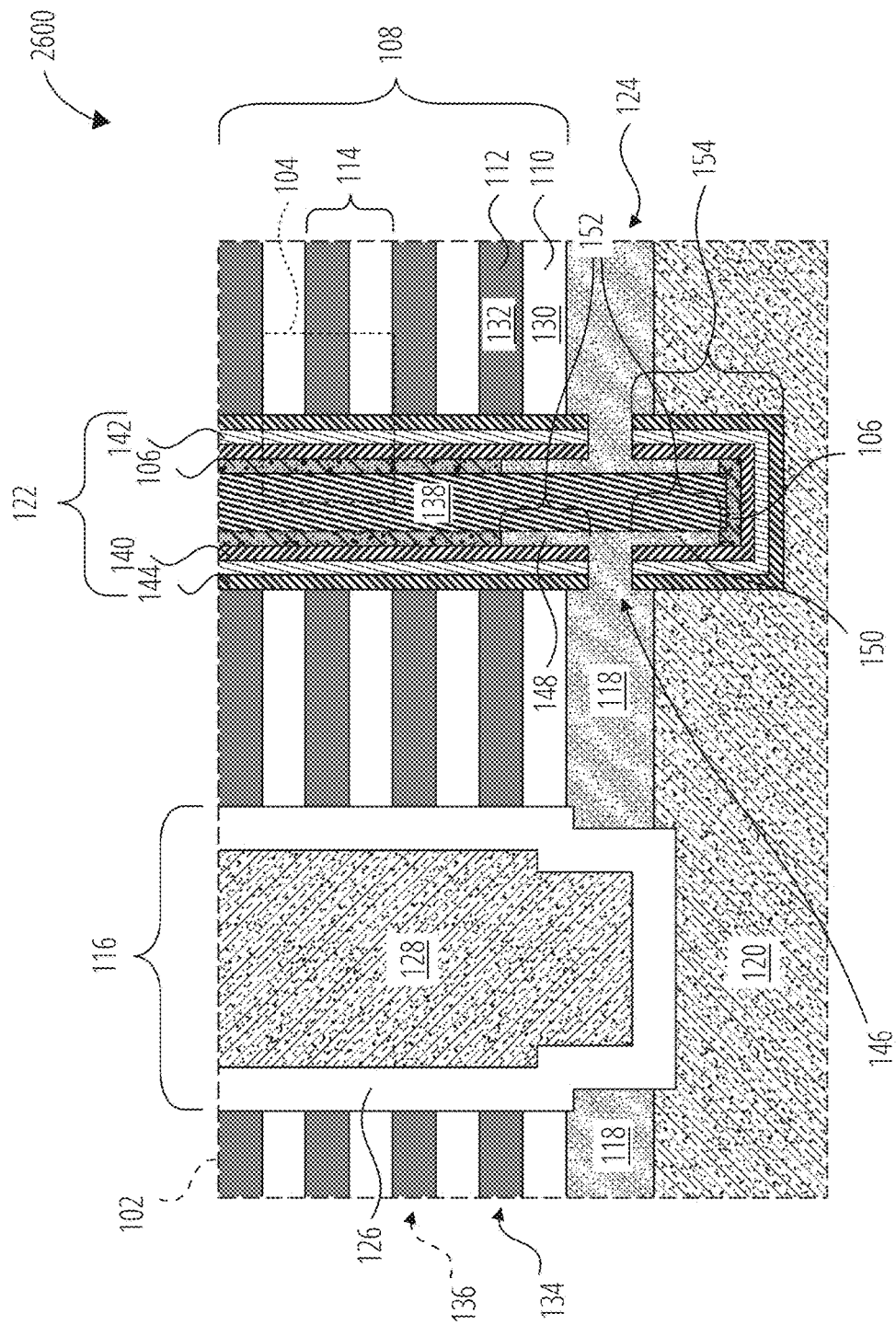

With reference to FIG. 26, the insulative liner 126 and the nonconductive fill material 128 may be formed to fill or substantially fill the slits 1402 (FIG. 25) and form the slit structures 116 in a manner similar to that described above with respect to completing the microelectronic device structure 100 of FIG. 1 after the stage of FIG. 15. Accordingly, formed is a microelectronic device structure 2600 that includes vertical extensions of the doped material 118 of the source region 124 so that the doped material 118 extends to or near levels of at least one of the source-side GIDL region(s) (e.g., one or both of the GIDL region 134 and/or additional GIDL regions 136), facilitating a reliable gated connection between the channel material 106 and the source-side GIDL regions.

Figure 27:
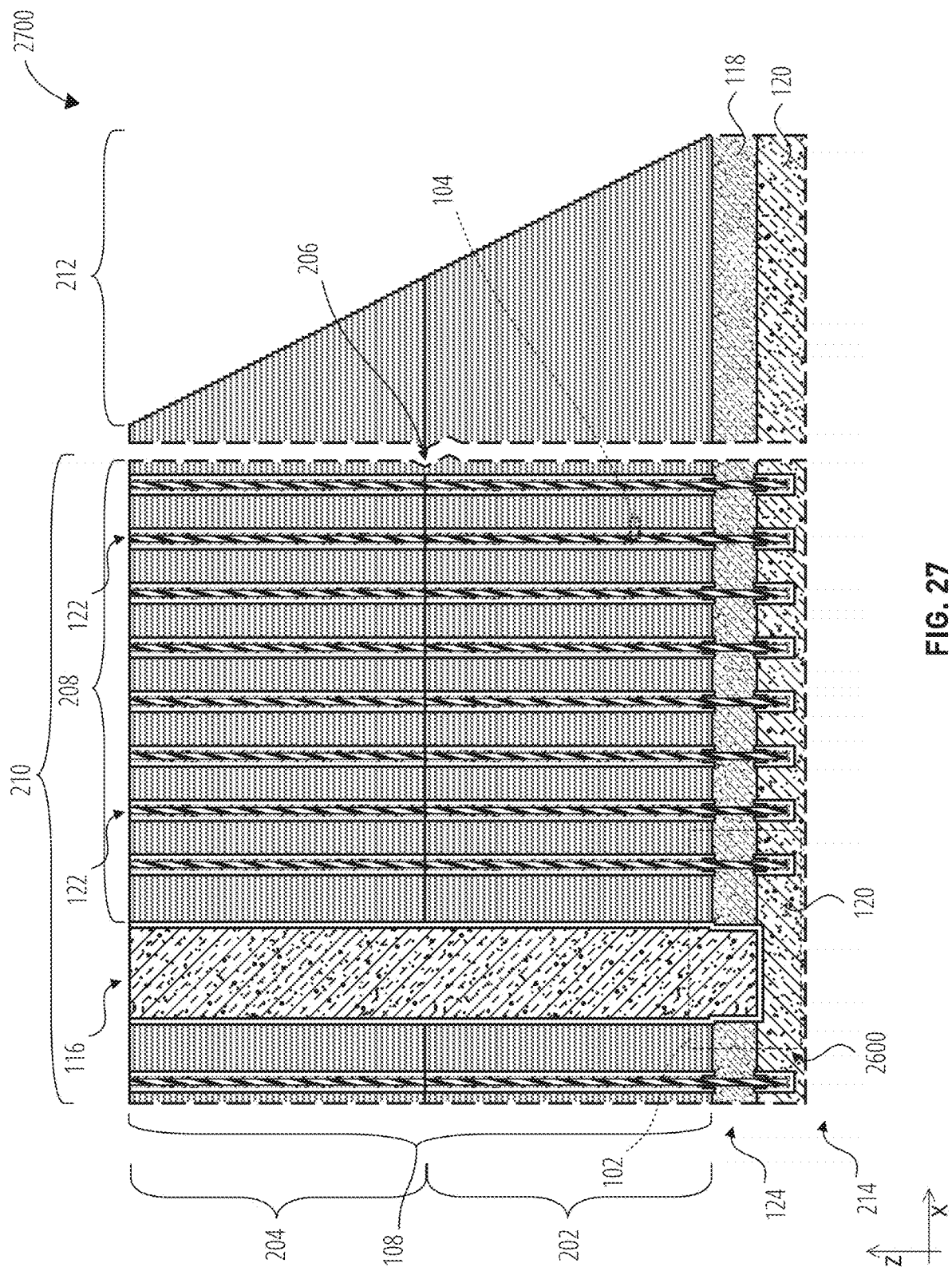
FIG. 27 is a cross-sectional, elevational, schematic illustration of a microelectronic device structure that may include the microelectronic device structure of FIG. 2 (and, therefore, also either or both of the memory cells 402 of FIG. 4A and/or FIG. 4B), such that the illustration of FIG. 26 may be an enlarged view corresponding to box 102 of FIG. 27 in accordance with embodiments of the disclosure. Moreover, a top, plan, schematic illustration of the microelectronic device structure of FIG. 27 may be that which is illustrated in FIG. 3, with the illustration of FIG. 27 being a view taken along section line A-A of FIG. 3.

The microelectronic device structure 2600, illustrated in the box 102 of FIG. 26, may be included as a portion of a larger microelectronic device structure 2700, illustrated in FIG. 27, such as the microelectronic device structure 100 of FIG. 1 may be included in the microelectronic device structure 200 of FIG. 2, as described above. The top plan schematic illustrated in FIG. 3 may likewise illustrate a top plan schematic of the pillar array portion 210 of the microelectronic device structure 2700 of FIG. 27, wherein the view of the pillar array portion 210 of FIG. 27 may be taken along section line A-A of FIG. 3.

Moreover, as described above with regard to the microelectronic device structure 200 of FIG. 2, multiple decks (e.g., the lower deck 202 and the upper deck 204) of the microelectronic device structure 2700 of FIG. 27 may be formed together, in accordance with the stages of FIG. 16 through FIG. 27. Alternatively, the microelectronic device structure 2600 may be formed, via the stages of FIG. 16 through FIG. 26, for the lower deck 202 of the microelectronic device structure 2700 of FIG. 27 before forming the upper deck 204 of the microelectronic device structure 2700 in separate stages.

By the foregoing methods (e.g., by the method illustrated in FIG. 5 through FIG. 15 and FIG. 1; by the method illustrated in FIG. 5, FIG. 6, and FIG. 16 through FIG. 27), the doped material 118 of the source region 124 is disposed proximate and, laterally overlapping with, or nearly laterally overlapping with, the elevation(s) of at least one source-side GIDL region. The proximity of the doped material 118 and the source-side GIDL region(s) (e.g., the GIDL region 134 (FIG. 1, FIG. 26)) may provide a relatively high dopant gradient proximate the source-side GIDL region(s) to enhance hole (e.g., electron hole) formation from the lower, source side of the pillars 122 (and the channel material 106) during block-erase operations. Accordingly, the gated connection between the source-side GIDL region(s) and the channel structures (of channel material 106) in the pillars 122 may be more reliable and enable microelectronic devices to be formed with greater numbers of tiers 114 (and therefore greater numbers of conductive structures 112 and memory cells 402) compared to conventional devices.

Moreover, the proximity of the dopant to the source-side GIDL region(s) may be accomplished without conducting processes for driving diffusion of the dopant from the source region (e.g., without conducting rapid thermal processing (RTP) acts) or by conducting lower temperature and/or shorter duration thermal diffusion processes. Therefore, thermally-driven diffusion processes may be avoided in some embodiments or, in other embodiments, may be conducted at lower temperatures (e.g., temperatures of about 700° C. or about 600° C. or less, rather than high temperatures of about 900° C. or greater) and/or at shorter durations, which may eliminate the use of temperature and/or timing conditions that could otherwise impair material or device characteristics, such as material degradation (e.g., bending of the pillars 122) and operational speed slowing (e.g., in the CMOS region 214 under the array of pillars 122).

Also, as described above, the methods may avoid using a vertical "punch" at the base of the pillar 122 (e.g., to remove a base portion of the channel material 106 and/or the cell materials in which dopant may then be implanted or otherwise formed). Therefore, the critical dimension ("CD") of the pillar 122 itself may be relatively narrower, and the pillar array portion 210 (FIG. 3) may be formed to a relatively greater pillar 122 density, than if the fabrication process necessitated a vertical etching at the base of a high-aspect-ratio opening to ensure disposition of a sufficient concentration of dopant adjacent the source-side GIDL region(s).

Figure 28:
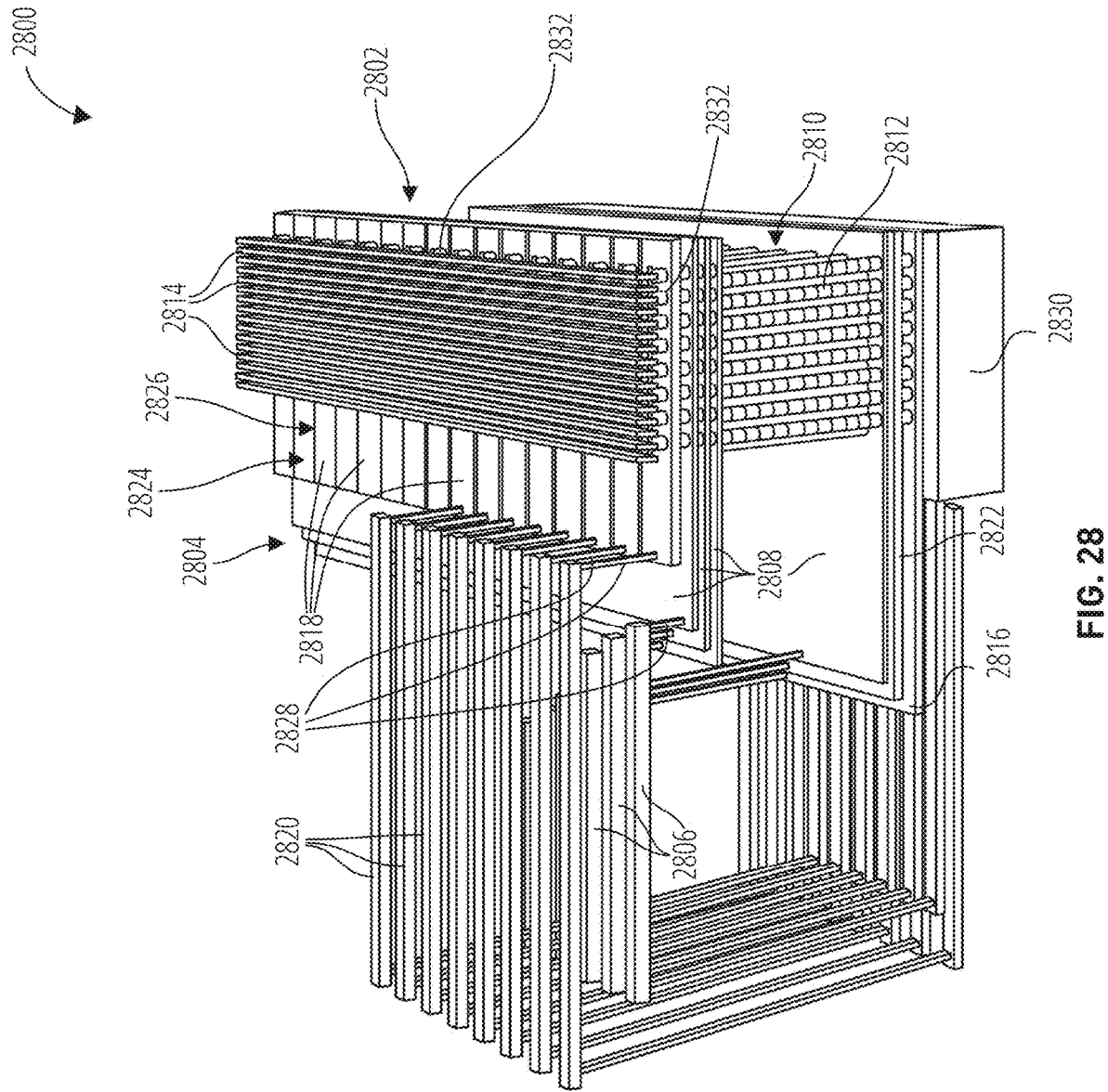
FIG. 28 is a partial, cutaway, perspective, schematic illustration of a microelectronic device, in accordance with embodiments of the disclosure.

With reference to FIG. 28, illustrated is a partial cutaway, perspective, schematic illustration of a portion of a microelectronic device 2800 (e.g., a memory device, such as a 3D NAND Flash memory device) including a microelectronic device structure 2802. The microelectronic device structure 2802 may be substantially similar to, e.g., the microelectronic device structure 200 of FIG. 2 (e.g., including the microelectronic device structure 100 of FIG. 1) and/or the microelectronic device structure 2700 of FIG. 27 (e.g., including the microelectronic device structure 2600 of FIG. 26).

As illustrated in FIG. 28, the microelectronic device structure 2802 may include a staircase structure 2804 (which may correspond to, e.g., the staircase portion 212 of the microelectronic device structure 200 of FIG. 2 and/or of the microelectronic device structure 2700 of FIG. 27). The staircase structure 2804 may define contact regions for connecting access lines 2806 to conductive tiers 2808 (e.g., conductive layers, conductive plates, such as the conductive structures 112 (e.g., FIG. 1, FIG. 26)) of a stack structure (e.g., the stack structure 108 (e.g., FIG. 1, FIG. 26)) in a deck (e.g., either or both the lower deck 202 (FIG. 2, FIG. 27) and/or the upper deck 204 (FIG. 2, FIG. 27)) of the microelectronic device structure 2802.

The microelectronic device structure 2802 may include pillars (e.g., the pillars 122 of FIG. 2 and/or FIG. 27) forming strings 2810 of memory cells 2812 (e.g., one or more of the memory cells 402' of FIG. 4A and/or the memory cells 402" of FIG. 4B). The pillars forming the strings 2810 of memory cells 2812 may extend at least somewhat vertically (e.g., in the Z-direction) and orthogonally relative to the conductive tiers 2808, relative to data lines 2814, relative to a source tier 2816 (e.g., the source region 124 of FIG. 2 and/or of FIG. 27), relative to access lines 2806, relative to first select gates 2818 (e.g., upper select gates, such as drain select gates (SGDs), which may include one or more regions configured as drain-side GIDL region(s)), relative to select lines 2820, and/or relative to one or more second select gates 2822 (e.g., lower select gate(s), such as source select gates (SGSs), which may include one or more regions configured as source-side GIDL region(s) (e.g., the GIDL region 134 and the additional GIDL region 136, if present, of FIG. 1 and FIG. 26)). As described above, portions of the source tier 2816 (e.g., the source region 124 (FIG. 2, FIG. 27)) vertically extend to an elevation proximate an elevation occupied by at least one of the source-side GIDL region(s) (e.g., the GIDL region 134, the additional GIDL region 136 of FIG. 1 and FIG. 26) of the second select gates 2822.

The first select gates 2818, the conductive tiers 2808, and the second select gates 2822 may be horizontally divided (e.g., in the X-axis direction) into multiple blocks 2824 (e.g., blocks 208 (FIG. 2, FIG. 3, FIG. 27)) spaced apart (e.g., in the X-axis direction) from one another by slits 2826 (e.g., slit structures 116 (FIG. 2 to FIG. 1 FIG. 3, FIG. 26, FIG. 27)).

Vertical conductive contacts 2828 may electrically couple components to each other, as illustrated. For example, select lines 2820 may be electrically coupled to the first select gates 2818, and the access lines 2806 may be electrically coupled to the conductive tiers 2808.

The microelectronic device 2800 may also include a control unit 2830 positioned under the memory array (e.g., the pillar array portions 210 (FIG. 2, FIG. 27)). The control unit 2830 may include control logic devices configured to control various operations of other features (e.g., the memory strings 2810, the memory cells 2812) of the microelectronic device 2800. By way of non-limiting example, the control unit 2830 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and/or other chip/deck control circuitry. The control unit 2830 may be electrically coupled to the data lines 2814, the source tier 2816, the access lines 2806, the first select gates 2818, and/or the second select gates 2822, for example. In some embodiments, the control unit 2830 may be configured as and/or include CMOS (complementary metal-oxide-semiconductor) circuitry. In such embodiments, the control unit 2830 may be characterized as having a "CMOS under Array" ("CuA") configuration. Accordingly, the control unit 2830 may be included in the CMOS region 214 of FIG. 2 and/or FIG. 27.

The first select gates 2818 may extend horizontally in a first direction (e.g., the Y-axis direction) and may be coupled to respective first groups of strings 2810 of memory cells 2812 at a first end (e.g., an upper end) of the strings 2810. The second select gates 2822 may be formed in a substantially planar configuration and may be coupled to the strings 2810 at a second, opposite end (e.g., a lower end) of the strings 2810 of memory cells 2812. As discussed above, portions of the source tier 2816 extend vertically upward to elevations that approach or laterally overlap at least one lower GIDL region (e.g., the GIDL region 134, the additional GIDL region 136 of FIG. 1 and FIG. 26) of the second select gates 2822.

The data lines 2814 (e.g., bit lines) may extend horizontally in a second direction (e.g., in the X-axis direction) that is at an angle (e.g., perpendicular) to the first direction in which the first select gates 2818 extend. The data lines 2814 may be coupled to respective second groups of the strings 2810 at the first end (e.g., the upper end) of the strings 2810. A first group of strings 2810 coupled to a respective first select gate 2818 may share a particular string 2810 with a second group of strings 2810 coupled to a respective data line 2814. Thus, a particular string 2810 may be selected at an intersection of a particular first select gate 2818 and a particular data line 2814. Accordingly, the first select gates 2818 may be used for selecting memory cells 2812 of the strings 2810 of memory cells 2812.

The conductive tiers 2808 (e.g., word lines, word line plates) may extend in respective horizontal planes. The conductive tiers 2808 may be stacked vertically, such that each conductive tier 2808 is coupled to all of the strings 2810 of memory cells 2812 in a respective block 2824, and the strings 2810 of the memory cells 2812 extend vertically through the stack(s) (e.g., decks, such as the lower deck 202 and the upper deck 204 of FIG. 2, FIG. 27) of conductive tiers 2808 of the respective block 2824. The conductive tiers 2808 may be coupled to, or may form control gates of, the memory cells 2812 to which the conductive tiers 2808 are coupled. Each conductive tier 2808 may be coupled to one memory cell 2812 of a particular string 2810 of memory cells 2812.

The first select gates 2818 and the second select gates 2822 may operate to select a particular string 2810 of the memory cells 2812 between a particular data line 2814 and the source tier 2816. Thus, a particular memory cell 2812 may be selected and electrically coupled to one of the data lines 2814 by operation of (e.g., by selecting) the appropriate first select gate 2818, second select gate 2822, and the conductive tier 2808 that are coupled to the particular memory cell 2812.

The staircase structure 2804 may be configured to provide electrical connection between the access lines 2806 and the conductive tiers 2808 through the vertical conductive contacts 2828. In other words, a particular level of the conductive tiers 2808 may be selected via one of the access lines 2806 that is in electrical communication with a respective one of the conductive contacts 2828 in electrical communication with the particular conductive tier 2808.

The data lines 2814 may be electrically coupled to the strings 2810 of memory cells 2812 through conductive structures 2832.

Figure 29:
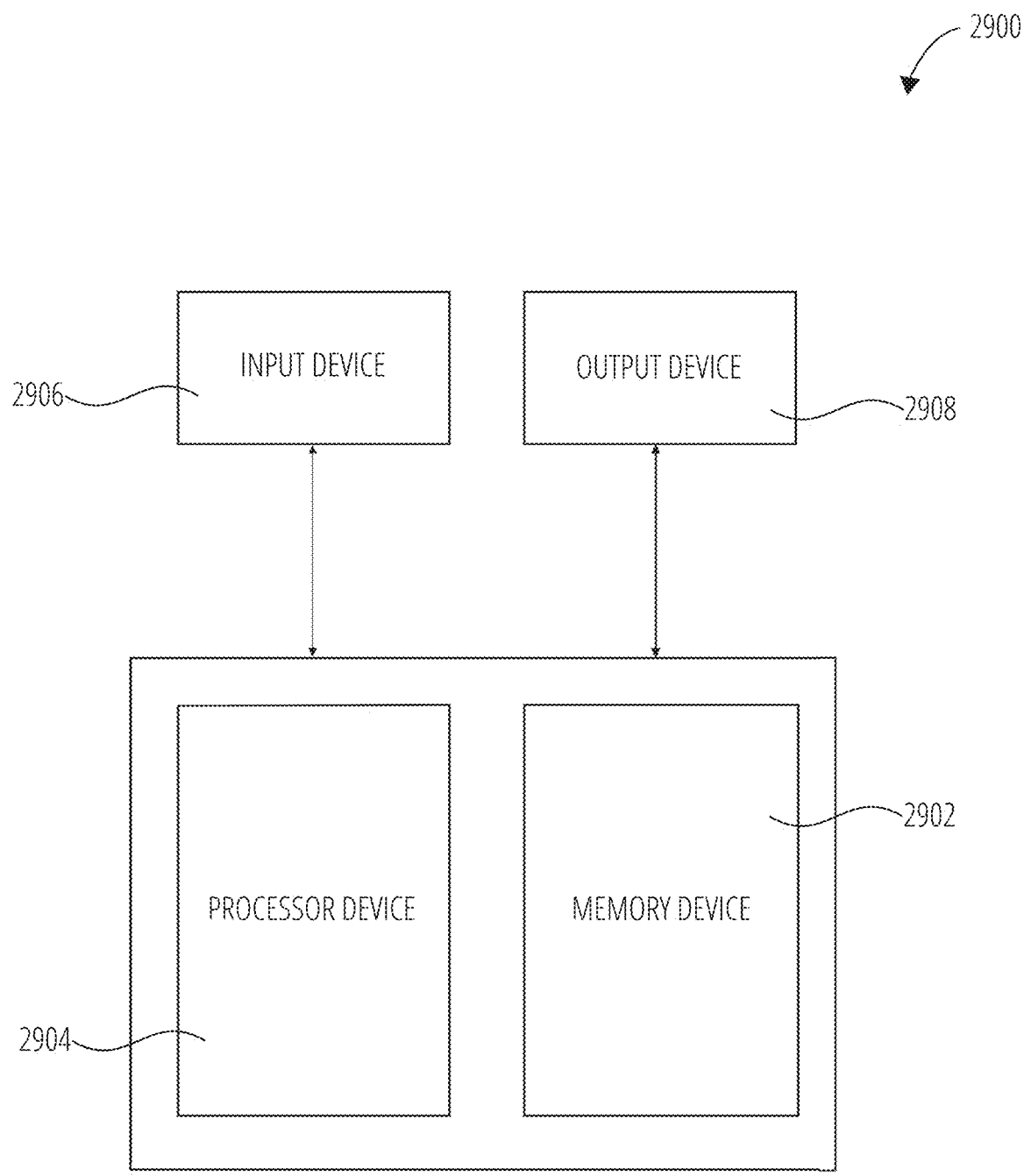
FIG. 29 is a block diagram of an electronic system, in accordance with embodiments of the disclosure.

Microelectronic devices (e.g., the microelectronic device 2800) including microelectronic device structures (e.g., the microelectronic device structure 100 of FIG. 1, the microelectronic device structure 200 of FIG. 2, the microelectronic device structure 2600 of FIG. 26, and/or the microelectronic device structure 2700 of FIG. 27) may be used in embodiments of electronic systems of the disclosure. For example, FIG. 29 is a block diagram of an electronic system 2900, in accordance with embodiments of the disclosure. The electronic system 2900 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc.

The electronic system 2900 includes at least one memory device 2902. The memory device 2902 may include, for example, one or more embodiment(s) of a microelectronic device and/or structure previously described herein (e.g., the microelectronic device 2800 of FIG. 28, the microelectronic device structure 100 of FIG. 1, the microelectronic device structure 200 of FIG. 2, the microelectronic device structure 2600 of FIG. 26, and/or the microelectronic device structure 2700 of FIG. 27), e.g., with structures formed according to embodiments previously described herein.

The electronic system 2900 may further include at least one electronic signal processor device 2904 (often referred to as a "microprocessor"). The processor device 2904 may, optionally, include an embodiment of a microelectronic device and/or a microelectronic device structure previously described herein (e.g., the microelectronic device 2800 of FIG. 28, the microelectronic device structure 100 of FIG. 1, the microelectronic device structure 200 of FIG. 2, the microelectronic device structure 2600 of FIG. 26, and/or the microelectronic device structure 2700 of FIG. 27). The electronic system 2900 may further include one or more input devices 2906 for inputting information into the electronic system 2900 by a user, such as, for example, a mouse or other pointing device, a keyboard, a touchpad, a button, or a control panel. The electronic system 2900 may further include one or more output devices 2908 for outputting information (e.g., visual or audio output) to a user such as, for example, a monitor, a display, a printer, an audio output jack, a speaker, etc. In some embodiments, the input device 2906 and the output device 2908 may comprise a single touchscreen device that can be used both to input information into the electronic system 2900 and to output visual information to a user. The input device 2906 and the output device 2908 may communicate electrically with one or more of the memory device 2902 and the electronic signal processor device 2904.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure. The at least one microelectronic device structure comprises a stack structure. The stack structure comprises insulative structures vertically interleaved with conductive structures. Pillars extend through the stack structure, through a region of doped material below the stack structure, and into a base structure below the region of the doped material. The doped material extends laterally into at least one of the pillars and extends upwardly within the at least one of the pillars to an interface with a channel material of the at least one of the pillars. The interface is at an elevation within the stack structure. The elevation of the interface is also an elevation proximate at least a lowermost of the conductive structures of the stack structure.

Figure 30:
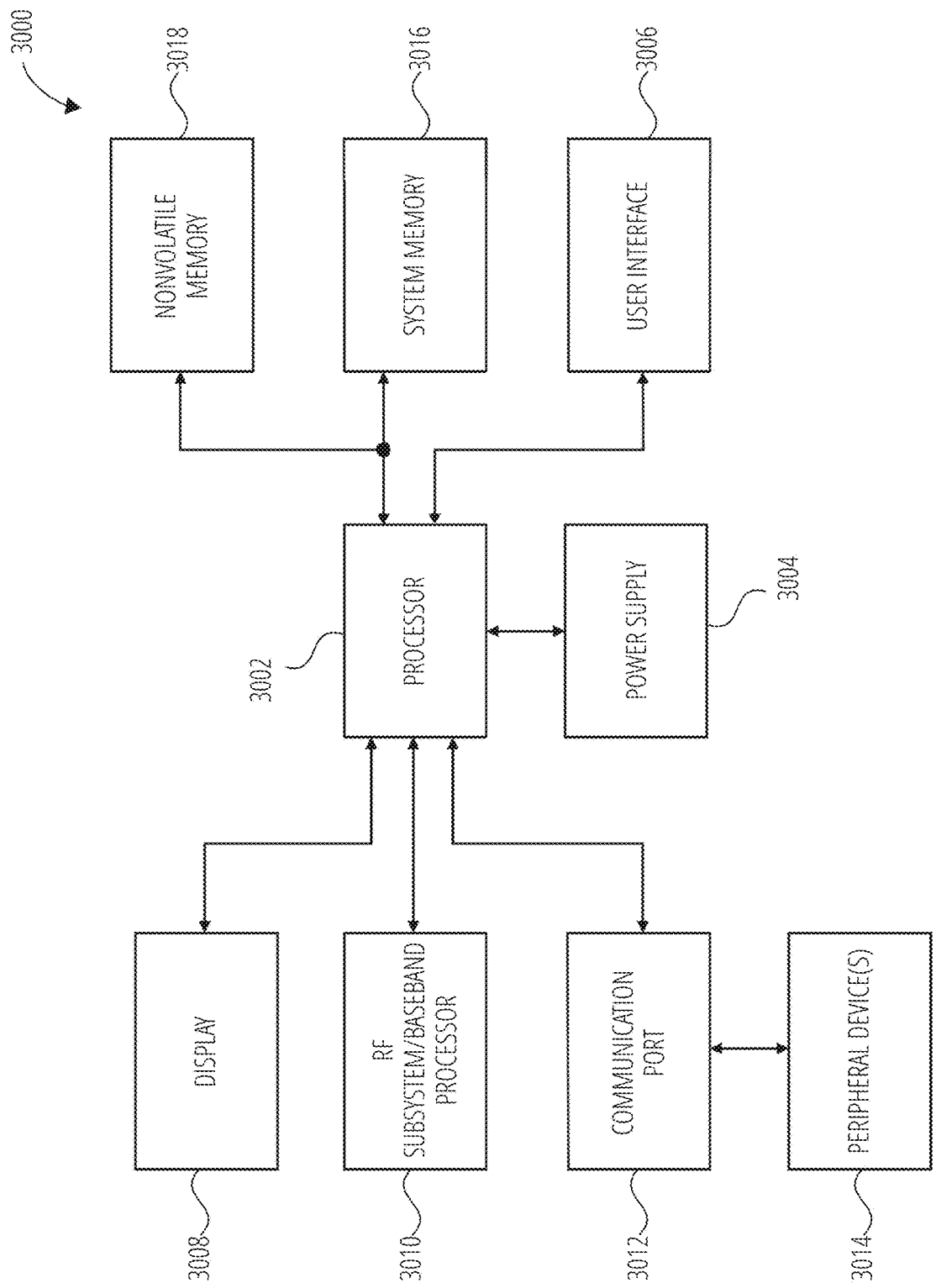
FIG. 30 is a block diagram of a processor-based system, in accordance with embodiments of the disclosure.

With reference to FIG. 30, shown is a block diagram of a processor-based system 3000. The processor-based system 3000 may include various microelectronic devices (e.g., the microelectronic device 2800 of FIG. 28) and microelectronic device structures (e.g., the microelectronic device structure 100 of FIG. 1, the microelectronic device structure 200 of FIG. 2, the microelectronic device structure 2600 of FIG. 26, and/or the microelectronic device structure 2700 of FIG. 27) manufactured in accordance with embodiments of the present disclosure. The processor-based system 3000 may be any of a variety of types, such as a computer, a pager, a cellular phone, a personal organizer, a control circuit, or another electronic device. The processor-based system 3000 may include one or more processors 3002, such as a microprocessor, to control the processing of system functions and requests in the processor-based system 3000. The processor 3002 and other subcomponents of the processor-based system 3000 may include microelectronic devices (e.g., the microelectronic device 2800 of FIG. 28) and microelectronic device structures (e.g., the microelectronic device structure 100 of FIG. 1, the microelectronic device structure 200 of FIG. 2, the microelectronic device structure 2600 of FIG. 26, and/or the microelectronic device structure 2700 of FIG. 27) manufactured in accordance with embodiments of the present disclosure.

The processor-based system 3000 may include a power supply 3004 in operable communication with the processor 3002. For example, if the processor-based system 3000 is a portable system, the power supply 3004 may include one or more of a fuel cell, a power scavenging device, permanent batteries, replaceable batteries, and/or rechargeable batteries. The power supply 3004 may also include an AC adapter; therefore, the processor-based system 3000 may be plugged into a wall outlet, for example. The power supply 3004 may also include a DC adapter such that the processor-based system 3000 may be plugged into a vehicle cigarette lighter or a vehicle power port, for example.

Various other devices may be coupled to the processor 3002 depending on the functions that the processor-based system 3000 performs. For example, a user interface 3006 may be coupled to the processor 3002. The user interface 3006 may include one or more input devices, such as buttons, switches, a keyboard, a light pen, a mouse, a digitizer and stylus, a touch screen, a voice recognition system, a microphone, or a combination thereof. A display 3008 may also be coupled to the processor 3002. The display 3008 may include an LCD display, an SED display, a CRT display, a DLP display, a plasma display, an OLED display, an LED display, a three-dimensional projection, an audio display, or a combination thereof. Furthermore, an RF subsystem/baseband processor 3010 may also be coupled to the processor 3002. The RF subsystem/baseband processor 3010 may include an antenna that is coupled to an RF receiver and to an RF transmitter. A communication port 3012, or more than one communication port 3012, may also be coupled to the processor 3002. The communication port 3012 may be adapted to be coupled to one or more peripheral devices 3014 (e.g., a modem, a printer, a computer, a scanner, a camera) and/or to a network (e.g., a local area network (LAN), a remote area network, an intranet, or the Internet).

The processor 3002 may control the processor-based system 3000 by implementing software programs stored in the memory (e.g., system memory 3016). The software programs may include an operating system, database software, drafting software, word processing software, media editing software, and/or media-playing software, for example. The memory (e.g., the system memory 3016) is operably coupled to the processor 3002 to store and facilitate execution of various programs. For example, the processor 3002 may be coupled to system memory 3016, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 3016 may include volatile memory, nonvolatile memory, or a combination thereof. The system memory 3016 is typically large so it can store dynamically loaded applications and data. In some embodiments, the system memory 3016 may include semiconductor devices (e.g., the microelectronic device 2800 of FIG. 28) and structures (e.g., the microelectronic device structure 100 of FIG. 1, the microelectronic device structure 200 of FIG. 2, the microelectronic device structure 2600 of FIG. 26, and/or the microelectronic device structure 2700 of FIG. 27), described above, or a combination thereof.

The processor 3002 may also be coupled to nonvolatile memory 3018, which is not to suggest that system memory 3016 is necessarily volatile. The nonvolatile memory 3018 may include one or more of STT-MRAM, MRAM, read-only memory (ROM) (e.g., EPROM, resistive read-only memory (RROM)), and Flash memory to be used in conjunction with the system memory 3016. The size of the nonvolatile memory 3018 is typically selected to be just large enough to store any necessary operating system, application programs, and fixed data. Additionally, the nonvolatile memory 3018 may include a high-capacity memory (e.g., disk drive memory, such as a hybrid-drive including resistive memory or other types of nonvolatile solid-state memory, for example). The nonvolatile memory 3018 may include microelectronic devices (e.g., the microelectronic device 2800 of FIG. 28) and structures (e.g., the microelectronic device structure 100 of FIG. 1, the microelectronic device structure 200 of FIG. 2, the microelectronic device structure 2600 of FIG. 26, and/or the microelectronic device structure 2700 of FIG. 27) described above, or a combination thereof.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a stack structure comprising a vertically alternating sequence of insulative structures and conductive structures arranged in tiers;
   at least one pillar extending through the stack structure, the at least one pillar comprising a channel material; and
   a source region below the stack structure, the source region comprising a doped material, a vertical extension of the doped material protruding upward to an interface with the channel material at an elevation within the stack structure,
   the doped material of the source region extending laterally through the channel material to directly contact an insulative core region of the at least one pillar.

2. The microelectronic device of claim 1, wherein the vertical extension of the doped material laterally overlaps in elevation at least a portion of a lowest conductive structure of the conductive structures of the stack structure.

3. The microelectronic device of claim 1, wherein the elevation to which the vertical extension of the doped material protrudes is within a range of:
   from about 10 nm below a lowest surface of a lowest conductive structure of the conductive structures of the stack structure,
   to about even with an upper surface of another conductive structure of the conductive structures of the stack structure.

4. The microelectronic device of claim 1, wherein the insulative core region of the at least one pillar comprises an insulative material, the channel material laterally surrounding the insulative material above the elevation to which the vertical extension of the doped material protrudes.

5. The microelectronic device of claim 1, wherein the at least one pillar further comprises cell materials laterally surrounding the channel material above the elevation to which the vertical extension of the doped material protrudes.

6. The microelectronic device of claim 5, wherein the channel material is vertically recessed relative to at least one of the cell materials.

7. The microelectronic device of claim 5, wherein the doped material of the source region extends laterally also through the cell materials.

8. The microelectronic device of claim 1, wherein the channel material comprises a lower portion below the insulative core region of the at least one pillar.

9. The microelectronic device of claim 1, wherein the doped material of the source region further comprises a lower vertical extension of the doped material protruding downward.

10. The microelectronic device of claim 1, wherein a height of the vertical extension of the doped material is greater than a thickness of a lowest insulative structure of the insulative structures of the stack structure.

11. The microelectronic device of claim 1, wherein the elevation, to which the vertical extension of the doped material protrudes, is about equal to an elevation of an upper surface of a lowest conductive structure of the conductive structures of the stack structure.

12. The microelectronic device of claim 1, wherein the vertical extension of the doped material laterally overlaps a lowest conductive structure and at least a portion of another conductive structure of the conductive structures of the stack structure.

13. A microelectronic device, comprising:
a stack structure comprising a vertically alternating sequence of insulative structures and conductive structures arranged in tiers;
at least one pillar extending through the stack structure, the at least one pillar comprising a channel material; and
a source region below the stack structure, the source region comprising a doped material, a vertical extension of the doped material protruding upward to an interface with the channel material at an elevation within the stack structure,
wherein the channel material comprises a lower portion below an insulative core of the at least one pillar, and
wherein the channel material, of the at least one pillar, further comprises an upper portion vertically spaced from the lower portion by the doped material.

14. A method of forming a microelectronic device, the method comprising:
forming, on a base structure, a stack of sacrificial materials;
forming, on the stack of sacrificial materials, a tiered stack structure comprising a vertically alternating sequence of insulative structures and other structures arranged in tiers;
forming a pillar opening through the tiered stack structure, through the stack of sacrificial materials, and into the base structure;
forming cell materials, a channel material, and an insulative core material in the pillar opening;
forming a slit through the tiered stack structure and at least partially through the stack of sacrificial materials;
selectively removing at least one of the sacrificial materials, of the stack of sacrificial materials, to expose at least one cell material formed in the pillar opening;
forming a lateral opening through the cell materials to expose a portion of the channel material in the lateral opening;
recessing the channel material to form a vertical recess protruding to an elevation within the tiered stack structure; and
forming a doped material in the vertical recess,
wherein the method forms a microelectronic device comprising:
a tiered stack structure comprising the vertically alternating sequence of the insulative structures and the other structures arranged in the tiers, the other structures comprising conductive structures;
at least one pillar extending through the tiered stack structure, the at least one pillar comprising the cell materials, the channel material, and the insulative core material formed in the pillar opening; and
a source region below the tiered stack structure, the source region comprising the doped material, a vertical extension of the doped material protruding upward in the vertical recess to an interface with the channel material at the elevation within the tiered stack structure,
the doped material of the source region extending laterally through the channel material to directly contact an insulative core region, formed from the insulative core material, of the at least one pillar.

15. The method of claim 14, wherein forming, on the base structure, the stack of sacrificial materials comprises:
forming, on the base structure, a lower region of a first sacrificial material;
forming, on the lower region of the first sacrificial material, a region of a second sacrificial material; and
forming, on the region of the second sacrificial material, an upper region of the first sacrificial material.

16. The method of claim 15, wherein forming a slit through the tiered stack structure and at least partially through the stack of sacrificial materials comprises forming the slit through the tiered stack structure and at least the upper region of the first sacrificial material.

17. The method of claim 16, wherein selectively removing the at least one of the sacrificial materials, of the stack of sacrificial materials, to expose the at least one cell material comprises selectively removing the region of the second sacrificial material without removing the lower region of the first sacrificial material and the upper region of the first sacrificial material.

18. The method of claim 14, wherein forming, on the base structure, the stack of sacrificial materials comprises:
forming, on the base structure, a lower region of SiCN;
forming, on the lower region of SiCN, a region of SiGe; and
forming, on the region of SiGe, an upper region of SiCN.

19. The method of claim 14, further comprising, after forming the doped material within the vertical recess, replacing the other structures, of the tiered stack structure, with the conductive structures.

20. The method of claim 14, further comprising, after forming the slit and before selectively removing the at least one of the sacrificial materials to expose the at least one cell material, replacing the other structures, of the tiered stack structure, with the conductive structures.

21. The method of claim 14, wherein forming the slit comprises forming the slit through the tiered stack structure and only partially through the stack of sacrificial materials.

22. The method of claim 14, wherein forming the slit comprises forming the slit through the tiered stack structure and through the stack of sacrificial materials.

23. The method of claim 14, wherein recessing the channel material further comprises forming a lower vertical recess protruding downward to an elevation within the base structure.

24. The method of claim 14, wherein recessing the channel material comprises leaving at least a portion of the channel material under the insulative core material.

25. An electronic system, comprising:
an input device;
an output device;
a processor device operably coupled to the input device and to the output device; and
a memory device operably coupled to the processor device and comprising at least one microelectronic device structure, the at least one microelectronic device structure comprising:
a stack structure comprising insulative structures vertically interleaved with conductive structures; and
pillars extending through the stack structure, through a region of doped material below the stack structure, and into a base structure below the region of the doped material, the pillars individually comprising a channel material laterally about an insulative core region, the doped material extending laterally into at least one of the pillars and extending upwardly within the at least one of the pillars to an interface with a channel material of the at least one of the pillars, the interface being at an elevation within the stack structure and proximate at least a lowermost of the conductive structures of the stack structure, and the doped material extending through the channel material to directly contact the insulative core region of the at least one of the pillars.

* * * * *